(12) United States Patent
Choi et al.

(10) Patent No.: US 11,804,393 B2
(45) Date of Patent: Oct. 31, 2023

(54) WAFER PROCESSING APPARATUS INCLUDING EQUIPMENT FRONT END MODULE (EFEM) AND WAFER PROCESSING METHOD USING THE SAME

(71) Applicant: SAMSUNG ELECTRONICS CO., LTD., Suwon-si (KR)

(72) Inventors: Jinhyuk Choi, Suwon-si (KR); Jonghwi Seo, Suwon-si (KR); Kongwoo Lee, Seoul (KR); Beomsoo Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 64 days.

(21) Appl. No.: 17/718,574

(22) Filed: Apr. 12, 2022

(65) Prior Publication Data

US 2023/0072147 A1 Mar. 9, 2023

(30) Foreign Application Priority Data

Sep. 9, 2021 (KR) .................. 10-2021-0120547

(51) Int. Cl.
*H01L 21/677* (2006.01)
*H01L 21/687* (2006.01)
*H01L 21/67* (2006.01)

(52) U.S. Cl.
CPC .. *H01L 21/67745* (2013.01); *H01L 21/67167* (2013.01); *H01L 21/68707* (2013.01)

(58) Field of Classification Search
CPC ........... H01L 21/67167; H01L 21/6773; H01L 21/67763; H01L 21/67736; H01L 21/67733; H01L 21/67745; H01L 21/67161; H01L 21/67196; H01L 21/67178; H01L 21/67184; H01L 21/67201; H01L 21/68707
See application file for complete search history.

(56) References Cited

U.S. PATENT DOCUMENTS

| | | | |
|---|---|---|---|
| 7,874,781 B2 | 1/2011 | Nozawa et al. | |
| 9,818,633 B2 | 11/2017 | Lill et al. | |
| 10,431,481 B2 | 10/2019 | Wakabayashi | |
| 10,510,573 B2 | 12/2019 | Kuo et al. | |
| 10,971,382 B2 | 4/2021 | Kim et al. | |
| 10,978,329 B2 | 4/2021 | Chou et al. | |
| 11,587,811 B2* | 2/2023 | Huang | H01L 21/67703 |
| 2008/0304944 A1* | 12/2008 | Sung | H01L 21/67017 414/935 |
| 2018/0114710 A1 | 4/2018 | Jeong et al. | |
| 2019/0206704 A1* | 7/2019 | Kisakibaru | B65G 47/90 |

* cited by examiner

*Primary Examiner* — Glenn F Myers
(74) *Attorney, Agent, or Firm* — Sughrue Mion, PLLC

(57) ABSTRACT

A wafer processing apparatus of an embodiment of the present disclosure may include an equipment front end module (EFEM), a wafer transfer chamber, a wafer processing chamber, and a wafer transfer arm. In addition, the EFEM may include an atmosphere control chamber configured to store a wafer carrier accommodating wafers, an upper air supplier configured to supply air into the atmosphere control chamber, an EFEM chamber under the atmosphere control chamber, a load lock arranged to be vertically overlapped by at least a portion of the EFEM chamber, and an EFEM arm configured to transfer the wafer carrier.

20 Claims, 27 Drawing Sheets

WAFER PROCESSING APPARATUS INCLUDING EQUIPMENT FRONT END MODULE (EFEM) AND WAFER PROCESSING METHOD USING THE SAME

CROSS-REFERENCE TO THE RELATED APPLICATION

This application is based on and claims priority under 35 U.S.C. § 119 to Korean Patent Application No. 10-2021-0120547, filed on Sep. 9, 2021, in the Korean Intellectual Property Office, the disclosure of which is incorporated by reference herein in its entirety.

BACKGROUND

Embodiments of the present disclosure relate to a wafer processing apparatus and a wafer processing method, and more particularly, to a wafer processing apparatus including an equipment front end module (EFEM) and a wafer processing method using the wafer processing apparatus.

A wafer processing apparatus may unload a wafer from a wafer carrier such as a front opening unified pod (FOUP), put the wafer into a wafer processing chamber, process the wafer inside the wafer processing chamber, take the processed wafer out of the wafer processing chamber, and put the wafer back into the wafer carrier. Recently, in order to improve wafer processing efficiency in a process chamber in which a wafer processing apparatus is installed, research for reducing the size of wafer processing apparatuses is actively being conducted.

SUMMARY

One of the problems solved by one or more embodiments of the present disclosure is to provide a wafer processing apparatus capable of improving wafer processing efficiency per unit area by reducing the size of a wafer processing apparatus installed in a process chamber.

According to one or more embodiments of the present disclosure, a wafer processing apparatus is provided. The wafer processing apparatus includes: a first EFEM including: a first atmosphere control chamber configured to store a first wafer carrier for accommodating a first wafer; a first upper air supplier configured to provide air into the first atmosphere control chamber; a first EFEM chamber under the first atmosphere control chamber; a first load lock vertically overlapped by at least a portion of the first EFEM chamber; and a first EFEM arm configured to transfer the first wafer carrier within the first atmosphere control chamber, the first EFEM chamber, and the first load lock. The wafer processing apparatus further includes: a wafer transfer chamber connected to the first load lock of the first EFEM; a plurality of wafer processing chambers connected to the wafer transfer chamber and providing a processing space for the first wafer; and a wafer transfer arm in the wafer transfer chamber, the wafer transfer arm configured to unload the first wafer from the first load lock and put the first wafer into at least one of the plurality of wafer processing chambers.

According to one or more embodiments of the present disclosure, a wafer processing apparatus is provided. The wafer processing apparatus includes an EFEM including: a first atmosphere control chamber configured to store a first wafer carrier for accommodating a first wafer; a first upper air supplier configured to supply air into the first atmosphere control chamber; a first EFEM chamber under the first atmosphere control chamber; a first load lock vertically overlapped by at least a portion of the first EFEM chamber; a first wafer aligner vertically overlapped by at least the portion of the first EFEM chamber and configured to align the first wafer; and a first EFEM arm configured to: unload the first wafer carrier from the first atmosphere control chamber and put the first wafer carrier into the first EFEM chamber, or unload the first wafer from the first wafer carrier and put the first wafer into at least one from among the first load lock and the first wafer aligner. The wafer processing apparatus further includes: a wafer transfer chamber connected to the first load lock of the first EFEM; a plurality of wafer processing chambers connected to the wafer transfer chamber and providing a processing space for the first wafer; and a wafer transfer arm in the wafer transfer chamber, the wafer transfer arm configured to unload the first wafer from the first load lock and put the first wafer into at least one of the plurality of wafer processing chambers.

According to one or more embodiments of the present disclosure, a wafer processing method is provided. The wafer processing method includes: putting a wafer carrier accommodating a wafer into an inner space of an atmosphere control chamber of an EFEM; closing the inner space of the atmosphere control chamber while the wafer carrier is within the inner space of the atmosphere control chamber; controlling an atmosphere of the inner space of the atmosphere control chamber to be the same as an atmosphere of an inner space of an EFEM chamber of the EFEM; connecting the inner space of the atmosphere control chamber and the inner space of the EFEM chamber to each other; and unloading, by an EFEM arm within the EFEM, the wafer carrier from the atmosphere control chamber and putting, by the EFEM arm, the wafer carrier into the EFEM chamber.

The load lock of the EFEM including the wafer processing apparatus according to an example embodiment of the present disclosure may be arranged to be overlapped by at least one portion of the EFEM chamber in a vertical direction. Accordingly, the size of the EFEM may be reduced, and the wafer processing efficiency per unit area of the wafer processing apparatus including the EFEM may be improved.

Further, the EFEM according to an example embodiment of the present disclosure may include a wafer carrier transfer arm configured to handle a wafer carrier accommodating a wafer as a whole, so that the wafer processing efficiency of a wafer processing apparatus including the EFEM may be improved.

BRIEF DESCRIPTION OF THE DRAWINGS

Embodiments of the present disclosure will be more clearly understood from the following detailed description taken in conjunction with the accompanying drawings in which.

DETAILED DESCRIPTION

Hereinafter, embodiments of the present disclosure will be described in detail with reference to the accompanying drawings.

Figure 1:
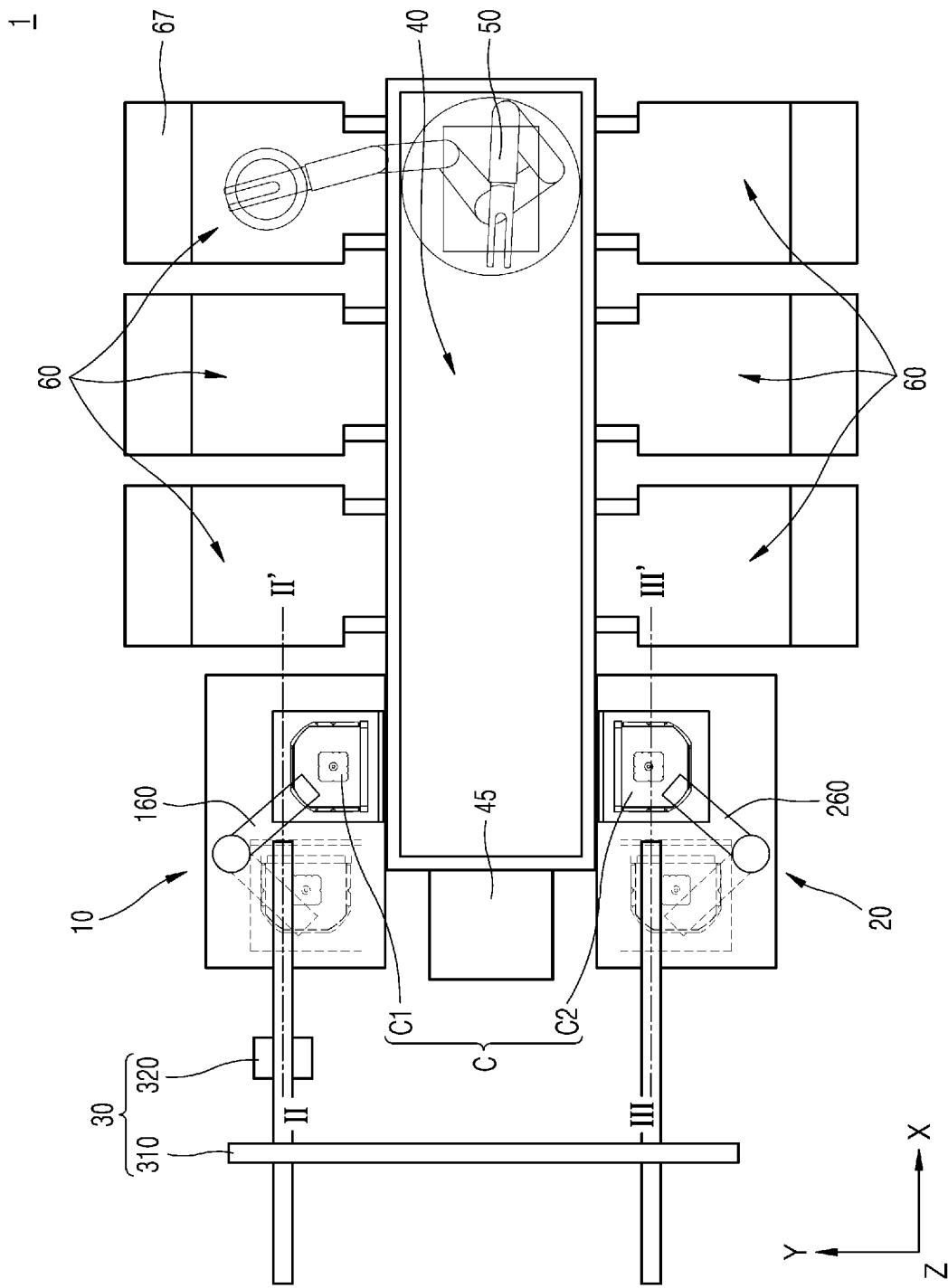
FIG. 1 is a plan view of a wafer processing apparatus according to an example embodiment of the present disclosure.

FIG. 1 is a plan view of a wafer processing apparatus 1 according to an example embodiment of the present disclosure. In addition, FIG. 2 is a cross-sectional view of a region indicated by II-II' in FIG. 1, and FIG. 3 is a cross-sectional view of a region indicated by III-III' in FIG. 1.

Figure 2:
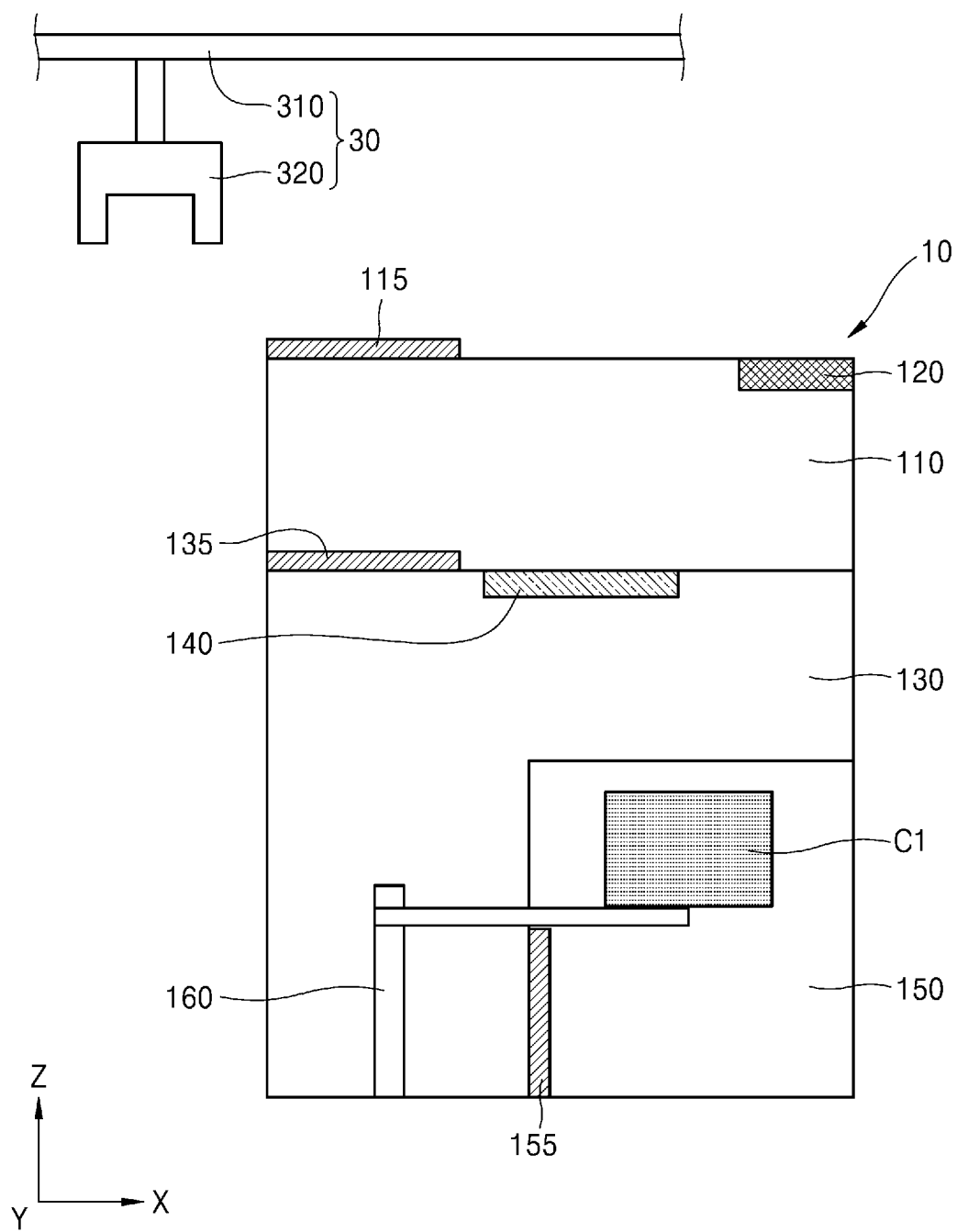
FIG. 2 is a cross-sectional view of a region indicated by II-II' in FIG. 1.
Figure 3:
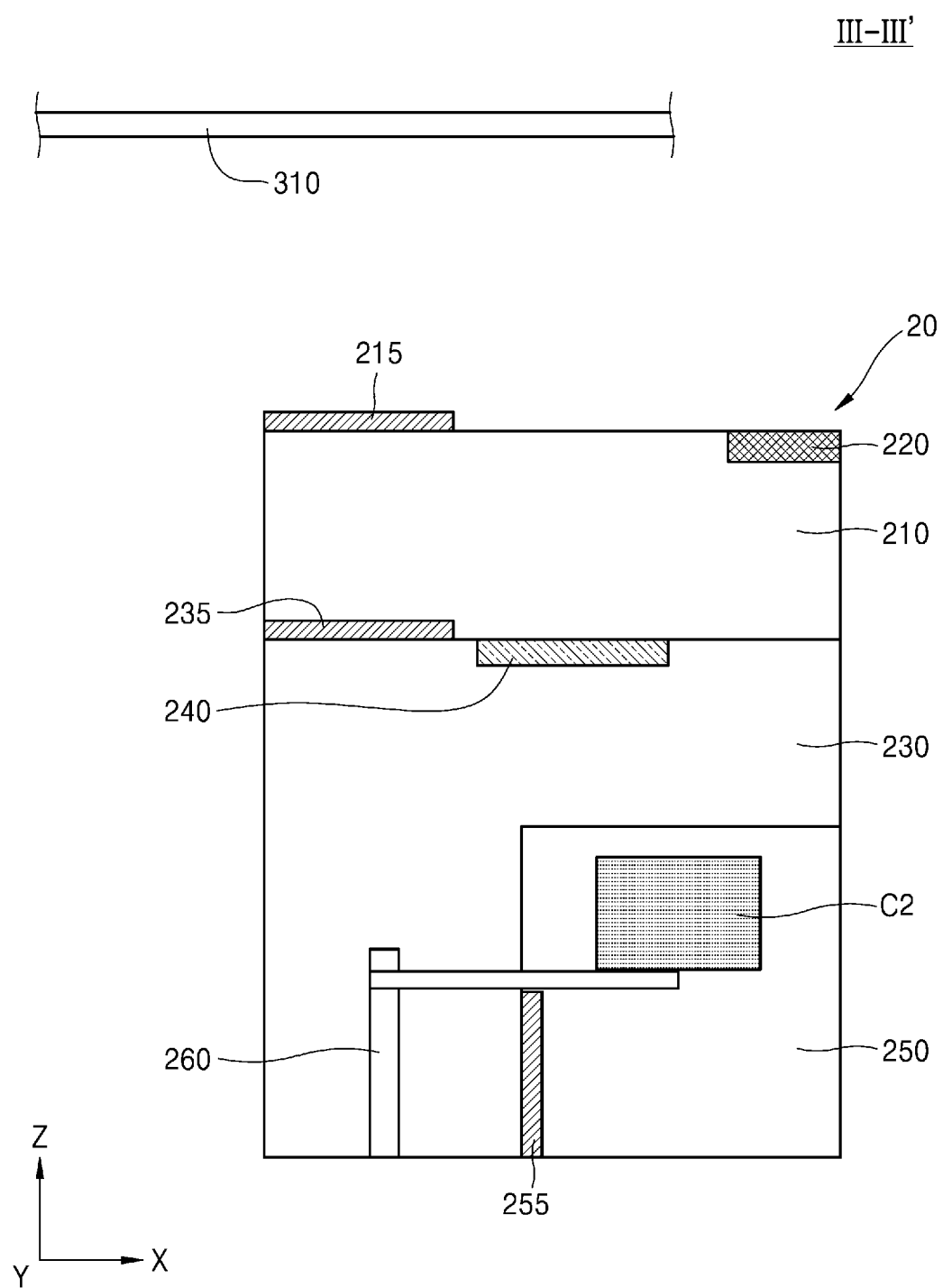
FIG. 3 is a cross-sectional view of a region indicated by III-III'' in FIG. 1.

Referring to FIGS. 1 to 3 together, the wafer processing apparatus 1 according to an example embodiment of the present disclosure may include a wafer carrier transfer apparatus 30, a first EFEM 10, a second EFEM 20, a wafer transfer chamber 40, a wafer aligner 45, a wafer transfer arm 50, a wafer processing chamber 60, and the like.

Hereinafter, a horizontal direction may be defined as a direction parallel to a direction in which a bottom surface of the first EFEM 10 and a bottom surface of the second EFEM 20 extend (e.g., a direction in which an X-Y plane extends). In addition, a vertical direction may be defined as a direction (e.g., Z direction) perpendicular to a direction in which the bottom surfaces of the first EFEM 10 and the second EFEM 20 extend.

The wafer carrier transfer apparatus 30 may be arranged above the first EFEM 10 and the second EFEM 20 and may be configured to transfer a wafer carrier C. In an example embodiment, the wafer carrier C may include a FOUP for accommodating a plurality of wafers. In addition, the wafer carrier C may include a carrier door configured to open or close an inner space in which a plurality of wafers are accommodated. In an example embodiment, the wafer carrier transfer apparatus 30 may include an overhead hoist transport apparatus.

In detail, the wafer carrier transfer apparatus 30 may transfer the wafer carrier C to the first EFEM 10 and the second EFEM 20 to perform a wafer processing process. In addition, the wafer carrier transfer apparatus 30 may receive the wafer carrier C for accommodating wafers on which wafer processing processes have been performed from the first EFEM 10 and the second EFEM 20 and transfer the wafer carrier C to a chamber for a subsequent process.

The wafer carrier transfer apparatus 30 may include a wafer carrier transfer line 310 and a wafer carrier transfer robot 320. The wafer carrier transfer line 310 is arranged above the first EFEM 10 and the second EFEM 20, and may provide a horizontal movement path of the wafer carrier transfer robot 320. For example, the wafer carrier transfer line 310 may extend in a horizontal direction (e.g., a direction in which the X-Y plane extends). For example, the wafer carrier transfer line 310 may include a guide rail.

The wafer carrier transfer robot 320 may horizontally move the wafer carrier C through a transfer path provided by the wafer carrier transfer line 310. For example, the wafer carrier transfer robot 320 may include a vehicle that moves along the wafer carrier transfer line 310. The wafer carrier transfer robot 320 may be configured to move in a vertical direction to pick up the wafer carrier C from a first atmosphere control chamber 110 of the first EFEM 10 and a second atmosphere control chamber 210 of the second EFEM 20, or to provide the wafer carrier C to the first atmosphere control chamber 110 of the first EFEM 10 and the second atmosphere control chamber 210 of the second EFEM 20. In an example embodiment, the wafer carrier transfer robot 320 may include a robot arm configured to grasp or grip the wafer carrier C.

The first EFEM 10 may be configured to move the first wafer carrier C1 received from the wafer carrier transfer apparatus 30, map the first wafer inside the first wafer carrier C1, put the first wafer carrier C1 into a first load lock 150, and form a vacuum pressure in the space of the first load lock 150.

The first EFEM 10 may include a first atmosphere control chamber 110, a first atmosphere control chamber door 115, a first upper air supply device 120 (e.g., an air supplier), a first EFEM chamber 130, and a first EFEM chamber door 135, a first lower air supply device 140 (e.g., an air supplier), the first load lock 150, a first load lock door 155, and a first EFEM arm 160.

The first atmosphere control chamber 110 may be a chamber configured to temporarily accommodate the first wafer carrier C1 accommodating the first wafer. In an example embodiment, the inner space of the first atmosphere control chamber 110 may accommodate the first wafer carrier C1. In addition, the atmosphere (e.g., humidity, temperature, pressure, etc.) of the inner space of the first atmosphere control chamber 110 may be controlled. For example, the humidity of the inner space of the first atmosphere control chamber 110 may be controlled by the first upper air supply device 120.

In an example embodiment, after the first wafer carrier C1 is put into the first atmosphere control chamber 110, the atmosphere of the inner space of the first atmosphere control chamber 110 may be controlled to be substantially the same as the atmosphere of the inner space of the first EFEM chamber 130. For example, after the first wafer carrier C1 is put into the first atmosphere control chamber 110, at least one of humidity, temperature, and pressure of the inner space of the first atmosphere control chamber 110 may be controlled to be substantially the same as the humidity, temperature, and pressure of the inner space of the first EFEM chamber 130.

The first atmosphere control chamber door 115 may be configured to open or close an opening of the first atmosphere control chamber 110. For example, the first atmosphere control chamber door 115 may be opened to expose the inner space of the first atmosphere control chamber 110 to the outside of the first EFEM 10. For example, the first atmosphere control chamber door 115 may be closed or blocked to separate the inner space of the first atmosphere control chamber 110 from the outside of the first EFEM 10. For example, the first atmosphere control chamber door 115 may be on a top surface of the first atmosphere control chamber 110.

In an example embodiment, when the first atmosphere control chamber door 115 exposes the inner space of the first atmosphere control chamber 110 to the outside, the wafer carrier transfer apparatus 30 may put the first wafer carrier C1 into the inner space of the first atmosphere control chamber 110.

Further, after the first wafer carrier C1 is put into the inner space of the first atmosphere control chamber 110, the first atmosphere control chamber door 115 may be closed to separate the inner space of the first atmosphere control chamber 110 from the outside.

The first upper air supply device 120 may be configured to supply air to the inside of the first atmosphere control chamber 110. As the first upper air supply device 120 supplies air to the inside of the first atmosphere control chamber 110, the humidity inside the first atmosphere control chamber 110 may be controlled.

In an example embodiment, the air supplied by the first upper air supply device 120 may include at least one of clean dry air (CDA) and nitrogen ($N_2$). Further, the first upper air supply device 120 may include at least one of a fan and a nozzle configured to supply air to the inside of the first atmosphere control chamber 110. For example, the first upper air supply device 120 may include a fan-filter unit (FFU) including a fan, an intake duct, an exhaust duct, and a filter.

In an example embodiment, the first upper air supply device 120 may be configured to supply the air of the first EFEM chamber 130 to the first atmosphere control chamber 110. For example, the first upper air supply device 120 may be connected to the inner space of the first EFEM chamber 130 through a duct to suck air in the inner space of the first EFEM chamber 130. Accordingly, the humidity inside the first atmosphere control chamber 110 may be controlled to be substantially the same as the humidity of the first EFEM chamber 130. However, the embodiments of the present disclosure are not limited thereto, and the first upper air supply device 120 may be configured to supply air outside of the first EFEM 10 to the inside of the first atmosphere control chamber 110.

The first EFEM chamber 130 may be disposed under the first atmosphere control chamber 110. Further, the first EFEM chamber 130 may provide a movement path of the first wafer carrier C1 received from the first atmosphere control chamber 110. In an example embodiment, the first EFEM chamber 130 may provide a space in which the first EFEM arm 160 is disposed.

The first EFEM chamber door 135 may be configured to open or close the path between the first atmosphere control chamber 110 and the first EFEM chamber 130. For example, the first EFEM chamber door 135 may be opened so that the inner space of the first EFEM chamber 130 communicates with the inner space of the first atmosphere control chamber 110. For example, the first EFEM chamber door 135 may be blocked or closed such that that the inner space of the first EFEM chamber 130 and the inner space of the first atmosphere control chamber 110 are separated from each other. For example, the first EFEM chamber door 135 may be arranged between the first EFEM chamber 130 and the first atmosphere control chamber 110.

In an example embodiment, after the atmosphere of the inner space of the first atmosphere control chamber 110 is adjusted to be substantially the same as the atmosphere of the inner space of the first EFEM chamber 130, the first EFEM chamber door 135 may be opened to connect the inner space of the first atmosphere control chamber 110 and the inner space of the first EFEM chamber 130. In addition, when the first EFEM chamber door 135 is opened, the first EFEM arm 160 may transfer the first wafer carrier C1 inside the inner space of the first atmosphere control chamber 110 to the inner space of the first EFEM chamber 130.

In addition, after the first wafer carrier C1 is put into the inner space of the first EFEM chamber 130, the first EFEM chamber door 135 may be closed. That is, the first EFEM chamber door 135 may separate the inner space of the first atmosphere control chamber 110 from the inner space of the first EFEM chamber 130.

The first lower air supply device 140 may be configured to supply air to the inside of the first EFEM chamber 130. As the first lower air supply device 140 supplies air to the inside of the first EFEM chamber 130, the humidity of the inner space of the first EFEM chamber 130 may be controlled, and the inner space of the first EFEM chamber 130 may be purified.

In an example embodiment, the air provided by the first lower air supply device 140 may include at least one of a clean dry air (CDA) and nitrogen ($N_2$). Further, the first lower air supply device 140 may include at least one of a fan and a nozzle configured to supply air to the inner space of the first EFEM chamber 130. For example, the first lower air supply device 140 may include a fan filter unit (FFU) composed of a fan, an intake duct, an exhaust duct, and a filter.

The first load lock 150 may be arranged to be vertically overlapped by at least a portion of the first EFEM chamber 130. For example, the first load lock 150 may be arranged in the inner space of the first EFEM chamber 130.

In an example embodiment, the first load lock 150 may include a first load lock chamber that provides a space in which the first wafer carrier C1 accommodating the first wafer is arranged. The first load lock 150 may spatially connect the first EFEM chamber 130 and the wafer transfer chamber 40 to each other. For example, the first load lock 150 may accommodate the first wafer carrier C1 with the carrier door opened.

The first load lock door 155 may be configured to be arranged between the first EFEM chamber 130 and the first load lock 150. For example, the first load lock door 155 may open or close an opening of the first load lock 150. For example, the first load lock door 155 may open or close a path between the first EFEM chamber 130 and the first load lock 150. The first load lock door 155 may connect the inner space of the first load lock 150 to the inner space of the first EFEM chamber 130, and separate the inner space of the first load lock 150 from the inner space of the first EFEM chamber 130. For example, the first load lock door 155 may be opened so that the inner space of the first EFEM chamber 130 and the inner space of the first load lock 150 communicate with each other. For example, the first load lock door 155 may be blocked or closed such that that the inner space of the first EFEM chamber 130 and the inner space of the first load lock 150 are separated from each other.

The first load lock 150 may control the pressure of the space in which the first wafer carrier C1 is accommodated. In an example embodiment, the first load lock 150 may control the pressure of the inner space in which the first wafer carrier C1 is accommodated to be substantially equal to that of the wafer transfer chamber 40 and the wafer processing chamber 60. For example, the first load lock 150 may control the pressure of the space in which the first wafer carrier C1 is accommodated as a vacuum pressure. For example, the pressure of the space of the first load lock 150 may be controlled to be 10 Torr or less, $10^{-1}$ Torr or less, or $10^{-3}$ Torr or less.

In an example embodiment, after the first load lock door 155 opens the inner space of the first load lock 150, the first EFEM arm 160 may put the first wafer carrier C1 arranged in the first EFEM chamber 130 into the inner space of the first load lock 150. Further, after the first wafer carrier C1 is put into the inner space of the first load lock 150, the first load lock door 155 may block or close the path between the first load lock door 155 and the first EFEM chamber 130. After the inner space of the first load lock 150 is blocked or closed, the pressure of the inner space of the first load lock 150 may be controlled as a vacuum pressure.

The first EFEM arm 160 may be configured to move inside the first EFEM chamber 130 to transfer the first wafer carrier C1. In an example embodiment, the first EFEM arm 160 may unload the first wafer carrier C1 from the first atmosphere control chamber 110 and put the first wafer carrier C1 into the first EFEM chamber 130, or may unload the first wafer carrier C1 from the first EFEM chamber 130 and put the first wafer carrier C1 into the first load lock 150.

In addition, the first EFEM arm 160 may unload the first wafer carrier C1 from the first load lock 150 and put the first wafer carrier C1 into the first EFEM chamber 130, or may unload the first wafer carrier C1 from the first EFEM chamber 130 and put the first wafer carrier C1 into the first atmosphere control chamber 110.

In an example embodiment, the first EFEM 10 may further include a vacuum pump (not shown) configured to adjust the pressure inside the first load lock 150 as a vacuum pressure.

Further, in an example embodiment, the first EFEM 10 may include a first wafer mapping device configured to check at least one of a number and a position of wafer in the first wafer carrier C1. For example, the first wafer mapping device may include a sensor for checking at least one of a number and a position of wafer. For example, the first wafer mapping device may include a vision sensor.

The first load lock 150 of the first EFEM 10 of the wafer processing apparatus 1 according to the example embodiment of the present disclosure may be arranged to be vertically overlapped by at least a portion of the first EFEM chamber 130. Accordingly, the size of the first EFEM 10 may be reduced, and the wafer processing efficiency per unit area of the wafer processing apparatus 1 including the first EFEM 10 may be improved.

The second EFEM 20 may be arranged to be spaced apart from the first EFEM 10 in a horizontal direction. For example, when the first EFEM 10 is arranged on one side of the wafer transfer chamber 40, the second EFEM 20 may be arranged on the other side opposite to the one side of the wafer transfer chamber 40.

The second EFEM 20 may include a second atmosphere control chamber 210, a second atmosphere control chamber door 215, and a second upper air supply device 220, a second EFEM chamber 230, a second EFEM chamber door 235, a second lower air supply device 240, a second load lock 250, a second load lock door 255, a second EFEM arm 260, and the like.

Hereinafter, some descriptions already given concerning the first EFEM 10 are omitted, and differences therefrom are described.

The second atmosphere control chamber 210 may be a chamber configured to temporarily accommodate the second wafer carrier C2 accommodating the second wafer. In an example embodiment, the inner space of the second atmosphere control chamber 210 may accommodate the second wafer carrier C2. In addition, the atmosphere of the inner space of the second atmosphere control chamber 210 (e.g., humidity, temperature, and pressure, etc.) may be controlled. For example, the humidity of the inner space of the second atmosphere control chamber 210 may be controlled by the second upper air supply device 220.

In an example embodiment, after the second wafer carrier C2 is put into the second atmosphere control chamber 210, the atmosphere of the inner space of the second atmosphere control chamber 210 may be controlled to be substantially the same as the atmosphere of the inner space of the second EFEM chamber 230. For example, after the second wafer carrier C2 is put into the second atmosphere control chamber 210, at least one of humidity, temperature, and pressure of the inner space of the second atmosphere control chamber 210 may be controlled to be substantially the same as the humidity, temperature, and pressure of the inner space of the second EFEM chamber 230

The second atmosphere control chamber door 215 may be configured to open or close an opening of second atmosphere control chamber 210. For example, the second atmosphere control chamber door 215 may be opened to expose the inner space of the second atmosphere control chamber 210 to the outside of the second EFEM 20. For example, the second atmosphere control chamber door 215 may be closed or blocked to separate the inner space of the second atmosphere control chamber 210 from the outside of the second EFEM 20. For example, the second atmosphere control chamber door 215 may be arranged on a top surface of the second atmosphere control chamber 210.

In an example embodiment, when the second atmosphere control chamber door 215 exposes the inner space of the second atmosphere control chamber 210 to the outside, the wafer carrier transfer apparatus 30 may put the second wafer carrier C2 into the inner space of the second atmosphere control chamber 210.

Further, after the second wafer carrier C2 is put into the inner space of the second atmosphere control chamber 210, the second atmosphere control chamber door 215 may be closed to separate the inner space of the second atmosphere control chamber 210 from the outside.

The second upper air supply device 220 may be configured to supply air to the inside of the second atmosphere control chamber 210. As the second upper air supply device 220 supplies air to the inside of the second atmosphere control chamber 210, the humidity inside the second atmosphere control chamber 210 may be controlled.

In an example embodiment, the air supplied by the second upper air supply device 220 may include at least one of clean dry air (CDA) and nitrogen ($N_2$). Further, the second upper air supply device 220 may include at least one of a fan and a nozzle configured to supply air to the inside of the second atmosphere control chamber 210. For example, the second upper air supply device 220 may include a fan-filter unit (FFU) including a fan, an intake duct, an exhaust duct, and a filter.

In an example embodiment, the second upper air supply device 220 may be configured to supply the air of the second EFEM chamber 230 to the second atmosphere control chamber 210. For example, the second upper air supply device 220 may be connected to the inner space of the second EFEM chamber 230 through a duct to suck air in the inner space of the second EFEM chamber 230. Accordingly, the humidity inside the second atmosphere control chamber 210 may be controlled to be substantially the same as the humidity of the second EFEM chamber 230. However, embodiments of the present disclosure are not limited thereto, and the second upper air supply device 220 may be configured to supply air outside of the second EFEM 20 to the inside of the second atmosphere control chamber 210.

The second EFEM chamber 230 may be disposed under the second atmosphere control chamber 210. Further, the second EFEM chamber 230 may provide a movement path of the second wafer carrier C2 received from the second atmosphere control chamber 210. In an example embodiment, the second EFEM chamber 230 may provide a space in which the second EFEM arm 260 is arranged.

The second EFEM chamber door 235 may be configured to open or close a path between the second atmosphere control chamber 210 and the second EFEM chamber 230. For example, the second EFEM chamber door 235 may be arranged between the second EFEM chamber 230 and the second atmosphere control chamber 210. For example, the second EFEM chamber door 235 may be opened so that the inner space of the second EFEM chamber 230 and the inner space of the second atmosphere control chamber 210 communicate with each other. For example, the second EFEM chamber door 235 may be blocked or closed such that that the inner space of the second EFEM chamber 230 and the inner space of the second atmosphere control chamber 210 are separated from each other.

In an example embodiment, after the atmosphere of the inner space of the second atmosphere control chamber 210 is adjusted to be substantially the same as the atmosphere of the inner space of the second EFEM chamber 230, the second EFEM chamber door 235 may be opened to connect the inner space of the second atmosphere control chamber 210 and the inner space of the second EFEM chamber 230. In addition, when the second EFEM chamber door 235 is opened, the second EFEM arm 260 may transfer the second wafer carrier C2 inside the inner space of the second atmosphere control chamber 210 to the inner space of the second EFEM chamber 230.

In addition, after the second wafer carrier C2 is put into the inner space of the second EFEM chamber 230, the second EFEM chamber door 235 may be closed. That is, the second EFEM chamber door 235 may separate the inner space of the second atmosphere control chamber 210 from the inner space of the second EFEM chamber 230.

The second lower air supply device 240 may be configured to supply air to the inside of the second EFEM chamber 230. As the second lower air supply device 240 supplies air to the inside of the second EFEM chamber 230, the humidity of the inner space of the second EFEM chamber 230 may be controlled, and the inner space of the second EFEM chamber 230 may be purified.

In an example embodiment, the air provided by the second lower air supply device 240 may include at least one of a clean dry air (CDA) and nitrogen ($N_2$). Further, the second lower air supply device 240 may include at least one of a fan and a nozzle configured to supply air to the inner space of the second EFEM chamber 230. For example, the second lower air supply device 240 may include an FFU composed of a fan, an intake duct, an exhaust duct, and a filter.

The second load lock 250 may be arranged to be vertically overlapped by at least a portion of the second EFEM chamber 230. For example, the second load lock 250 may be disposed in the inner space of the second EFEM chamber 230.

In an example embodiment, the second load lock 250 may include a second load lock chamber that provides a space in which the second wafer carrier C2 accommodating the second wafer is arranged. The second load lock 250 may spatially connect the second EFEM chamber 230 and the wafer transfer chamber 40 to each other. For example, the second load lock 250 may accommodate the second wafer carrier C2 with the carrier door opened.

The second load lock door 255 may be configured to be arranged between the second EFEM chamber 230 and the second load lock 250. For example, the second load lock door 255 may open or close an opening of the second load lock 250. For example, the second load lock door 255 may open or close a path between the second EFEM chamber 230 and the second load lock 250. The second load lock door 255 may connect the inner space of the second load lock 250 to the inner space of the second EFEM chamber 230, and separate the inner space of the second load lock 250 from the inner space of the second EFEM chamber 230. For example, the second load lock door 255 may be opened so that the inner space of the second EFEM chamber 230 and the inner space of the second load lock 250 communicate with each other. For example, the second load lock door 255 may be blocked or closed such that that the inner space of the second EFEM chamber 230 and the inner space of the second load lock 250 are separated from each other.

The second load lock 250 may control the pressure of the space in which the second wafer carrier C2 is accommodated. In an example embodiment, the second load lock 250 may control the pressure of the inner space in which the second wafer carrier C2 is accommodated to be substantially equal to that of the wafer transfer chamber 40 and the wafer processing chamber 60. For example, the second load lock 250 may control the pressure of the space in which the second wafer carrier C2 is accommodated as a vacuum pressure. For example, the pressure of the space of the second load lock 250 may be controlled to be 10 Torr or less, $10^{-1}$ Torr or less, or $10^{-3}$ Torr or less.

In an example embodiment, after the second load lock door 255 opens the inner space of the second load lock 250, the second EFEM arm 260 may put the second wafer carrier C2 inside the second EFEM chamber 230 into the inner space of the second load lock 250. Further, after the second wafer carrier C2 is put into the inner space of the second load lock 250, the second load lock door 255 may be closed to separate the inner space of the second load lock 250 from the inner space of the second EFEM chamber 230. After the second load lock door 255 is closed, the pressure of the inner space of the second load lock 250 may be controlled as a vacuum pressure.

The second EFEM arm 260 may be configured to move inside the second EFEM chamber 230 to transfer the second wafer carrier C2. In an example embodiment, the second EFEM arm 260 may unload the second wafer carrier C2 from the second atmosphere control chamber 210 and put the second wafer carrier C2 into the second EFEM chamber 230, or may unload the second wafer carrier C2 from the second EFEM chamber 230 and put the second wafer carrier C2 into the second load lock 250.

In addition, the second EFEM arm 260 may unload the second wafer carrier C2 from the second load lock 250 and put the second wafer carrier C2 into the second EFEM chamber 230, or may unload the second wafer carrier C2 from the second EFEM chamber 230 and put the second wafer carrier C2 into the second atmosphere control chamber 210.

In an example embodiment, the second EFEM 20 may further include a vacuum pump (not shown) configured to adjust the pressure inside the second load lock 250 as a vacuum pressure.

Further, in an example embodiment, the second EFEM 20 may include a second wafer mapping device configured to check at least one of a number and a position of wafer in the second wafer carrier C2. For example, the second wafer mapping device may include a vision sensor. For example, the second wafer mapping apparatus may include a sensor for checking at least one of the number and the position of wafer.

The second load lock 250 of the second EFEM 20 of the wafer processing apparatus 1 according to the example embodiment of the present disclosure may be arranged to be vertically overlapped by at least a portion of the second EFEM chamber 230. Accordingly, the size of the second EFEM 20 may be reduced, and the wafer processing efficiency per unit area of the wafer processing apparatus 1 including the second EFEM 20 may be improved.

The wafer transfer chamber 40 may provide a transfer space for the first wafer and the second wafer. For example, at least one of the first wafer and the second wafer may be taken out from the first wafer carrier C1 inside the first load lock 150 and the second wafer carrier C2 inside the second load lock 250 using the wafer transfer arm 50, and be input into at least one of a plurality of the wafer processing chamber 60.

In an example embodiment, a portion of the wafer transfer chamber 40 may be connected to the first load lock 150 of the first EFEM 10 and the second load lock 250 of the second EFEM 20, and another portion of the wafer transfer chamber 40 may be connected to the plurality of the wafer processing chamber 60.

In an example embodiment, the wafer transfer chamber 40 may be arranged between the first EFEM 10 and the second EFEM 20. In addition, the pressure inside the wafer transfer chamber 40 may be controlled to be substantially equal to the pressure of the plurality of the wafer processing chamber 60. For example, the pressure inside the wafer transfer chamber 40 may be controlled as a vacuum pressure.

The wafer aligner 45 may be mounted on the front surface of the wafer transfer chamber 40 and may be configured to align at least one of the first wafer and the second wafer. In a plan view, the wafer aligner 45 may be provided between the first EFEM 10 and the second EFEM 20. In an example embodiment, when the first EFEM 10 and the second EFEM 20 are mounted on the sides of the wafer transfer chamber 40, the wafer aligner 45 may be mounted on the front surface of the wafer transfer chamber 40 to be arranged between the first EFEM 10 and the second EFEM 20.

In an example embodiment, the wafer aligner 45 may include a spinner configured to rotate the first wafer and the second wafer such that the first wafer and the second wafer face a preset orientation. For example, the wafer aligner 45 may be configured to sense a notch formed in the first wafer and the second wafer, and rotate the first wafer and the second wafer based on the sensed positions of the notch.

In addition, the wafer aligner 45 may further include an air supply device configured to supply air in a horizontal direction to reduce a phenomenon in which particles are attached on the surfaces of the first wafer and the second wafer.

The wafer transfer arm 50 may move in a horizontal direction (e.g., X direction) inside the wafer transfer chamber 40, and may unload the first wafer from the first wafer carrier C1 inside the first load lock 150 of the first EFEM 10 and the second wafer from the second wafer carrier C2 in the second load lock 250 of the second EFEM 20, and put the first wafer and the second wafer into the wafer processing chamber 60.

In addition, the wafer transfer arm 50 may be configured to unload the processed wafer from the wafer processing chamber 60 and put the wafer into the first wafer carrier C1 inside the first load lock 150 of the first EFEM 10 and the second wafer carrier C2 in the second load lock 250 of the second EFEM 20.

In addition, the wafer transfer arm 50 may unload the first wafer and the second wafer from the first wafer carrier C1 inside the first load lock 150 of the first EFEM 10 and the second wafer carrier C2 in the second load lock 250 of the second EFEM 20, to put the first wafer and the second wafer into the wafer aligner 45.

The wafer processing chamber 60 may provide a space in which the first wafer and the second wafer received from the wafer transfer arm 50 are processed. In an example embodiment, a plurality of the wafer processing chamber 60 may be provided.

In an example embodiment, the plurality of the wafer processing chamber 60 may be mounted on at least one side of the wafer transfer chamber 40 and may be extended in the X direction. Further, a plurality of processing boxes 67 may be on the plurality of the wafer processing chamber 60. Some of the plurality of processing boxes 67 may accommodate components for plasma processing, and others of the plurality of processing boxes 67 may store gases for plasma processing.

Figure 4:
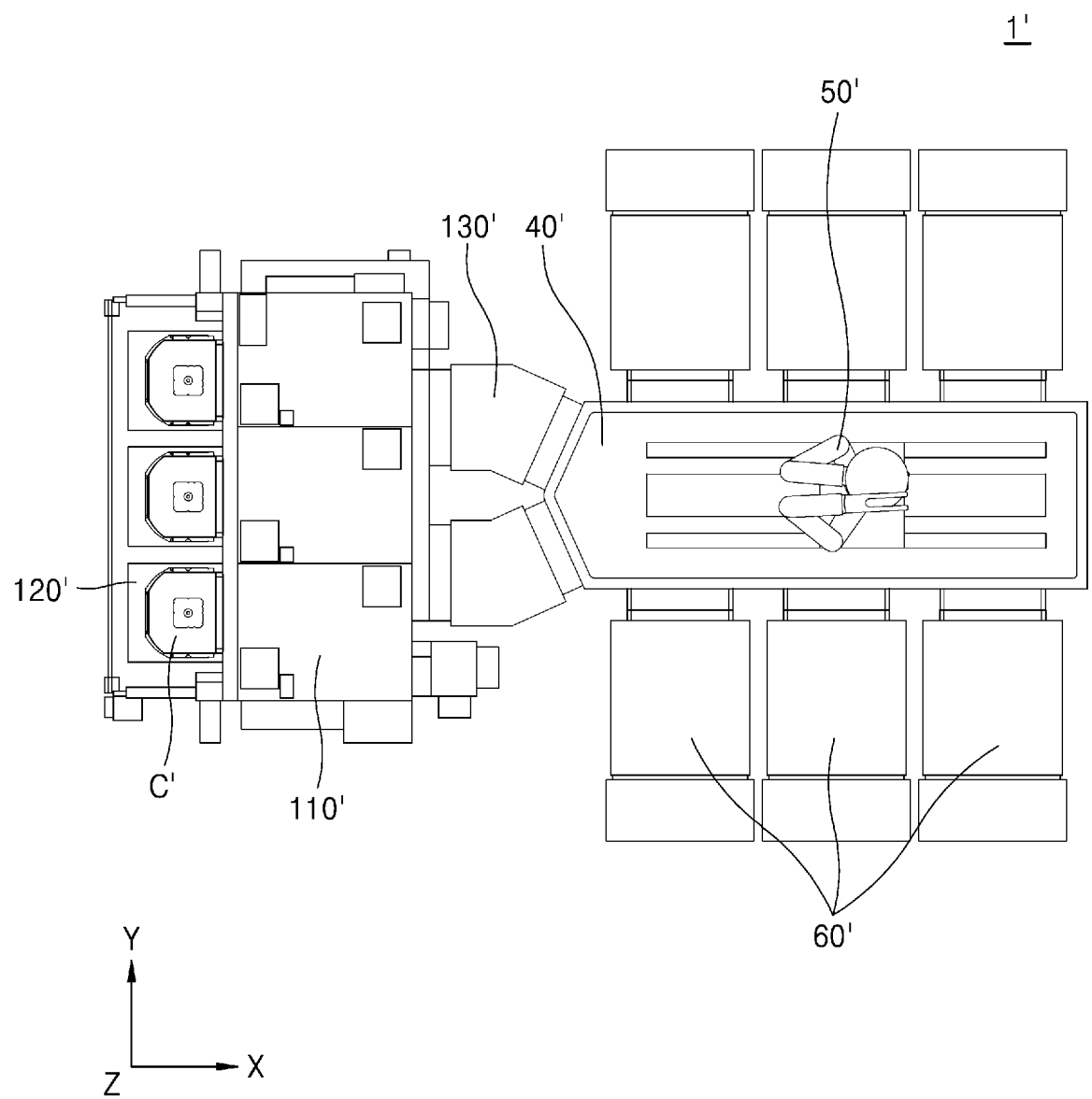
FIG. 4 is a cross-sectional view of a wafer processing apparatus according to a comparative example.

FIG. 4 is a cross-sectional view of a wafer processing apparatus 1' according to a comparative example.

Referring to FIG. 4, a wafer processing apparatus 1' according to a comparative example may include an EFEM including an EFEM chamber 110', a load port 120' supporting a wafer carrier C', and a load lock 130', a wafer transfer chamber 40', a wafer transfer robot 50', and a wafer processing chamber 60'.

Referring to FIG. 4, when the wafer processing apparatus 1' according to the comparative example is viewed from a plan view, the load port 120' supporting the wafer carrier C' may be on the front side of the EFEM chamber 110', and the load lock 130' may be on the back side of the EFEM chamber 110'.

That is, when the wafer processing apparatus 1' is viewed from a plan view, the load lock 130' may not be vertically overlapped by the EFEM chamber 110'. Accordingly, the wafer processing apparatus 1 may be provided in a relatively large size. For example, the length in the X direction of the wafer processing apparatus 1' may be relatively large.

The first load lock 150 and the second load lock 250 of the wafer processing apparatus 1 of the embodiment of the present disclosure described with reference to FIGS. 1 to 3 may be vertically overlapped by the first EFEM chamber 130 and the second EFEM chamber 230, respectively, so that the size of the wafer processing apparatus 1 may be reduced. For example, the size of the wafer processing apparatus 1 of embodiments of the present disclosure may be smaller than the size of the wafer processing apparatus 1' according to the comparative example.

In detail, the length in the X direction of the wafer processing apparatus 1 according to the example embodiment of the present disclosure may be less than the length in the X direction of the wafer processing apparatus 1' according to the comparative example. Accordingly, the wafer processing efficiency per unit area of the wafer processing apparatus 1 of embodiments of the present disclosure may be improved.

Hereinafter, a wafer processing method using the wafer processing apparatus 1 according to an example embodiment of the present disclosure is described in more detail.

FIGS. 5A to 5H are diagrams illustrating respective steps of a wafer processing method according to an example embodiment of the present disclosure.

Figure 5A:
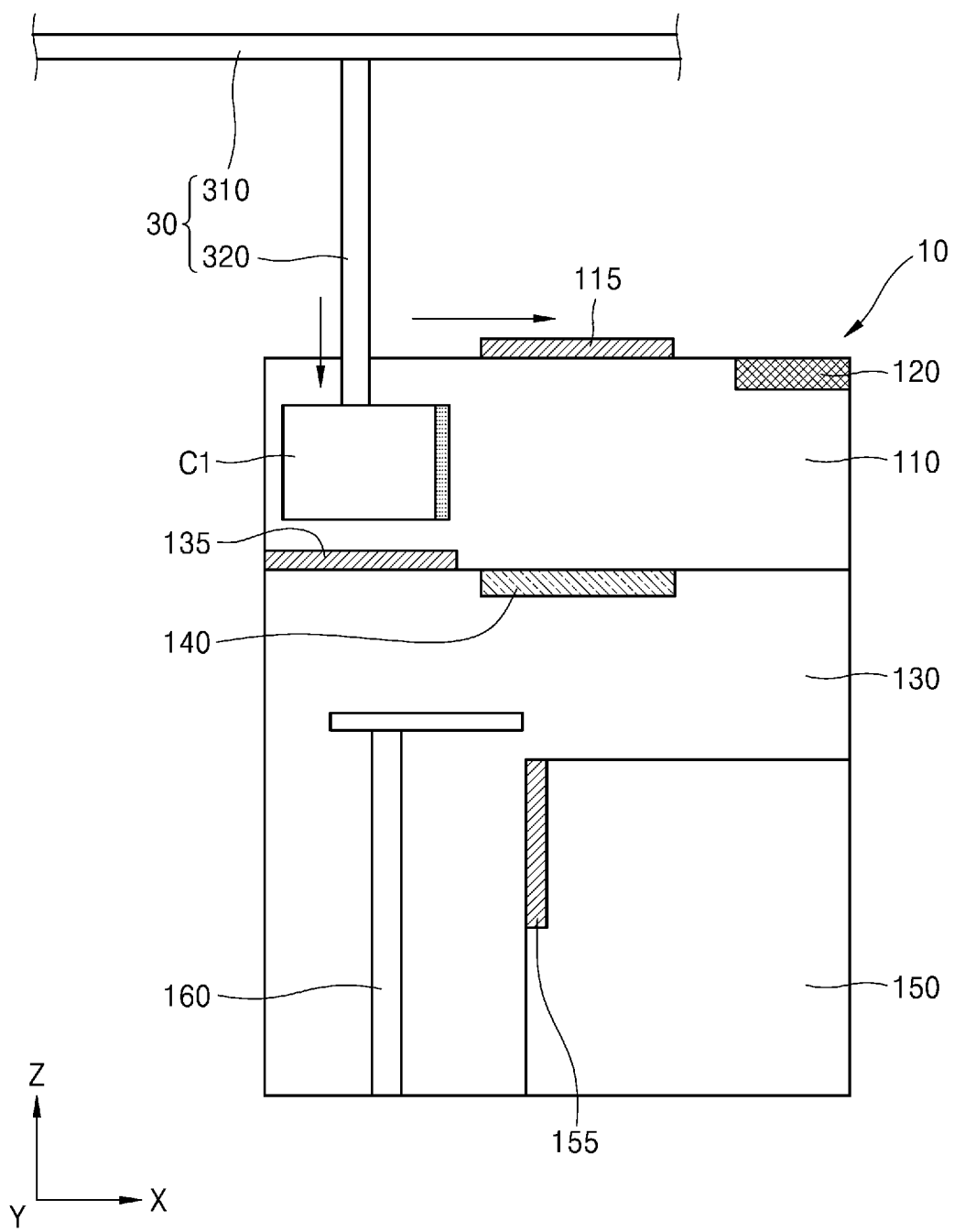
FIG. 5A is a diagram illustrating a step of a wafer processing method according to an example embodiment of the present disclosure.

Referring to FIG. 5A, a wafer processing method according to an example embodiment of the present disclosure may include disposing a first wafer carrier C1 accommodating a first wafer in the first atmosphere control chamber 110 on the first EFEM chamber 130 (S1100).

In an example embodiment, in step S1100, the first atmosphere control chamber door 115 may open the opening the first atmosphere control chamber 110. Further, the wafer carrier transfer apparatus 30 may put the first wafer carrier C1 into the inner space of the first atmosphere control chamber 110.

In an example embodiment, the wafer carrier transfer robot 320 of the wafer carrier transfer apparatus 30 may move in a horizontal direction and a vertical direction to put the first wafer carrier C1 into the first atmosphere control chamber 110.

Figure 5B:
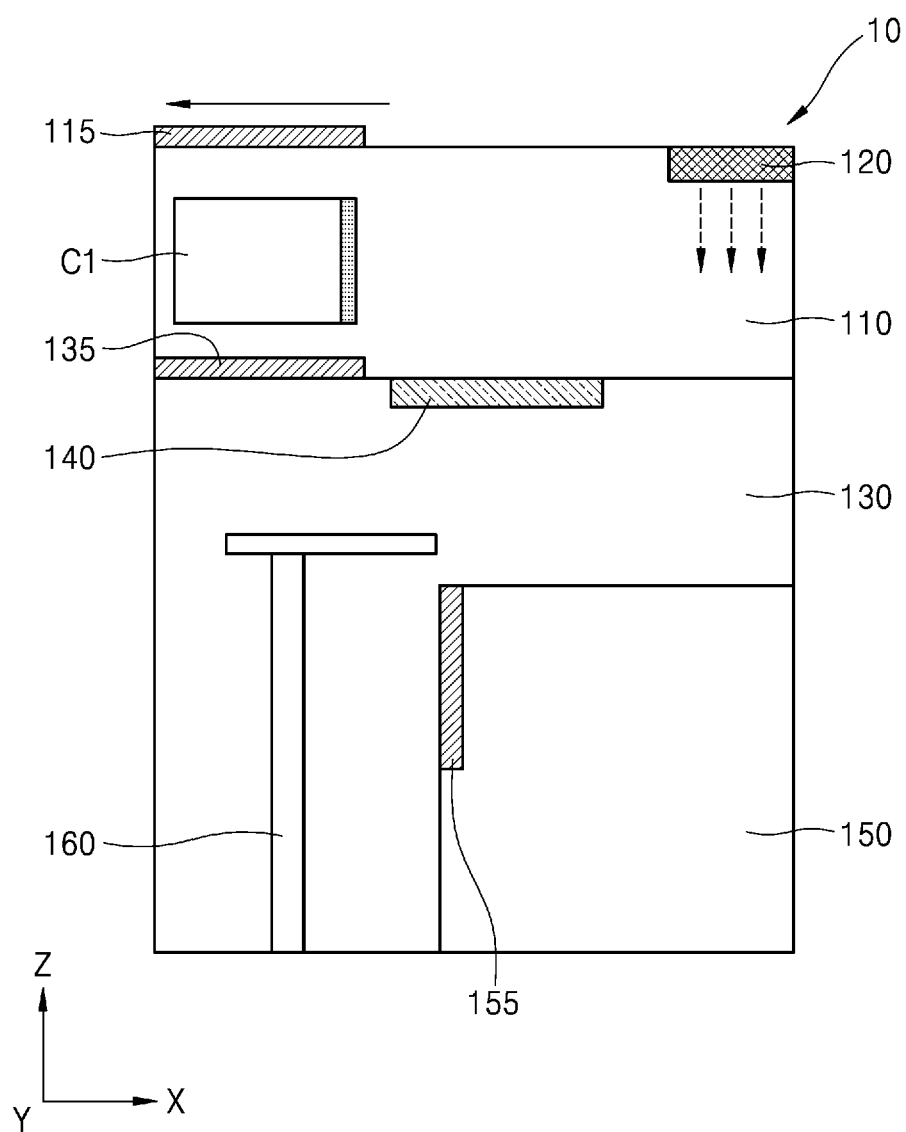
FIG. 5B is a diagram illustrating a step of the wafer processing method according to the example embodiment of the present disclosure.

Referring to FIG. 5B, a wafer processing method according to an example embodiment of the present disclosure may include blocking (or sealing) the inner space of the first atmosphere control chamber 110, and controlling the atmosphere of the inner space of the first atmosphere control chamber 110 to be substantially the same as the atmosphere of the inner space of the first EFEM chamber 130 (S1200).

In an example embodiment, in step S1200, after the first wafer carrier C1 is put into the inner space of the first atmosphere control chamber 110, the first atmosphere control chamber door 115 may close to separate the inner space of the first atmosphere control chamber 110 from the outside of the first EFEM 10.

In an example embodiment, in step S1200, after the first atmosphere control chamber door 115 is closed, the atmosphere of the inner space of the first atmosphere control chamber 110 may be controlled to be substantially the same as the atmosphere of the first EFEM chamber 130. For example, at least one of the humidity, temperature, and pressure of the inner space of the first atmosphere control chamber 110 may be controlled to be the same as or similar to humidity, temperature, and pressure of the inner space of the first EFEM chamber 130.

In an example embodiment, in step S1200, the first upper air supply device 120 may be configured to suck air from the inner space of the first EFEM chamber 130 and discharge the air to the inner space of the first atmosphere control chamber 110. For example, the first upper air supply device 120 may suck air from the inner space of the first EFEM chamber 130 through a duct connected to the inner space of the first EFEM chamber 130 and discharge the sucked air to the inner space of the first atmosphere control chamber 110. Accordingly, the humidity of the first atmosphere control chamber 110 may be substantially the same as or similar to the humidity of the inner space of the first EFEM chamber 130.

Not limited to the above, in step S1200, the step of heating the inside of the first atmosphere control chamber 110 by using a heat source (not shown) so that the temperature of the first atmosphere control chamber 110 is substantially the same as or similar to the temperature of the first EFEM chamber 130 may be additionally performed.

Also, in step S1200, the step of controlling the pressure of the inner space of the first atmosphere control chamber 110 by using a pump (not shown) so that the pressure of the first atmosphere control chamber 110 is substantially equal to the pressure of the first EFEM chamber 130 may be additionally performed.

Figure 5C:
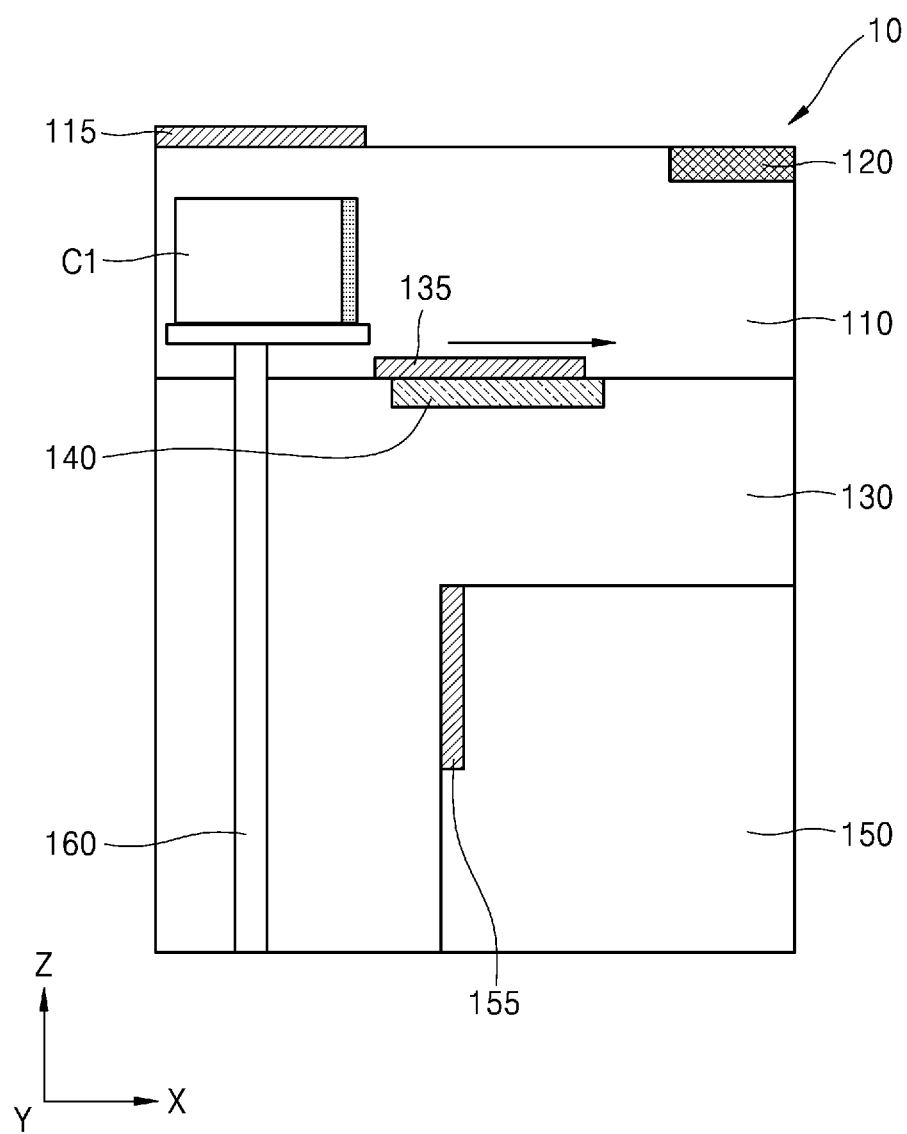
FIG. 5C is a diagram illustrating a step of the wafer processing method according to the example embodiment of the present disclosure.

Referring to FIG. 5C, a wafer processing method according to an example embodiment of the present disclosure may include connecting the inner space of the first atmosphere control chamber 110 to the inner space of the first EFEM chamber 130 (S1300).

In an example embodiment, in step S1300, the first EFEM chamber door 135 is opened, so the inner space of the first atmosphere control chamber 110 and the inner space of the first EFEM chamber 130 may be connected to each other.

The atmosphere of the inner space of the first EFEM chamber 130 may be controlled to be substantially the same as or similar to the atmosphere of the inner space of the first atmosphere control chamber 110 through the above-described step S1200, so that physical damage to the first wafer inside the first wafer carrier C1 may be prevented in step S1300.

Figure 5D:
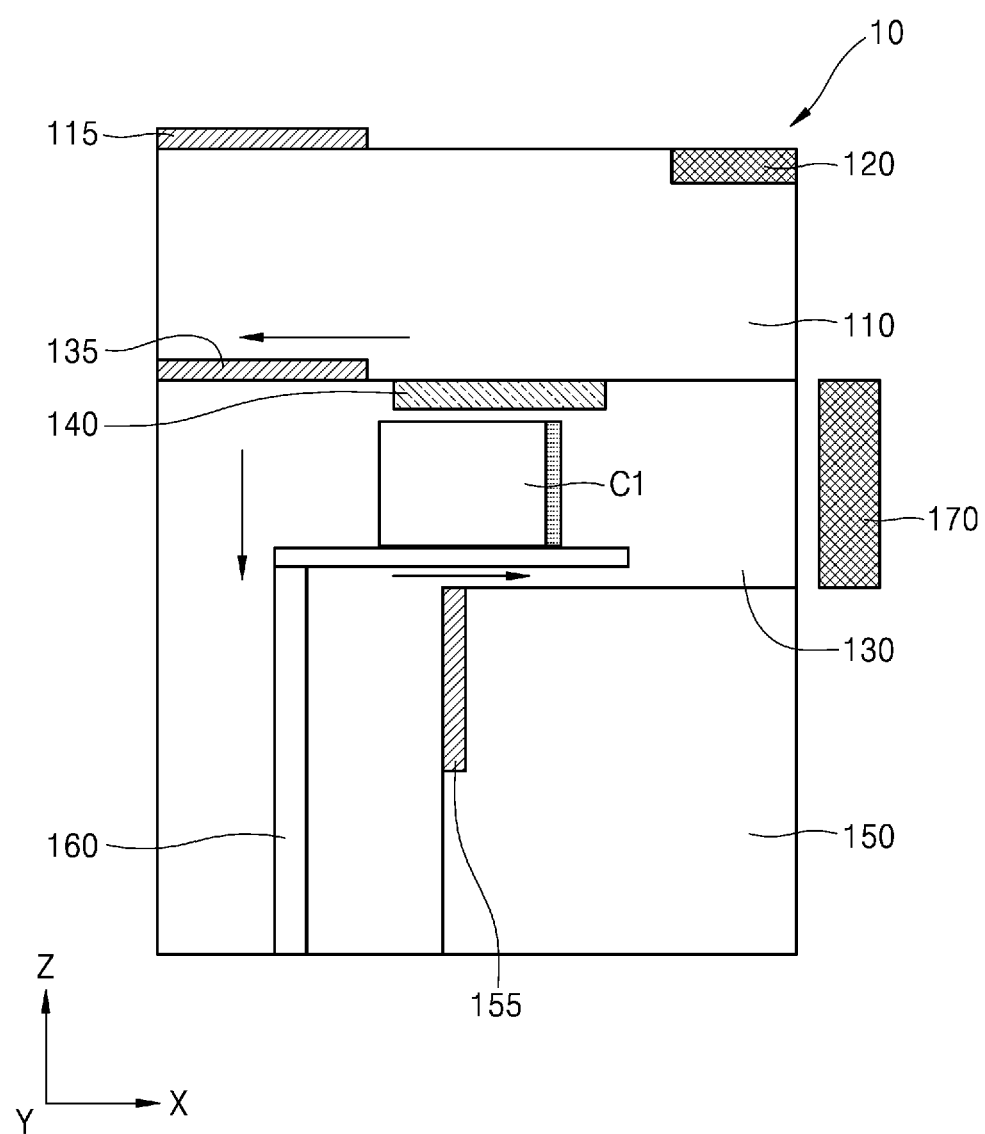
FIG. 5D is a diagram illustrating a step of the wafer processing method according to the example embodiment of the present disclosure.

Referring to FIG. 5D, a wafer processing method according to an example embodiment of the present disclosure may include taking out the first wafer carrier C1 from the first atmosphere control chamber 110 by using the first EFEM arm 160 moving in the inner space of the first EFEM chamber 130 and putting the first wafer carrier C1 into the first EFEM chamber 130 (S1400).

In an example embodiment, in step S1400, the first EFEM arm 160 may move in a vertical direction inside the first EFEM chamber 130 to transfer the first wafer carrier C1 inside the first atmosphere control chamber 110 to the first EFEM chamber 130. Further, in step S1400, the first EFEM arm 160 may move in a horizontal direction inside the first EFEM chamber 130 to transfer the first wafer carrier C1 to a position adjacent to the first wafer mapping device 170.

Figure 5E:
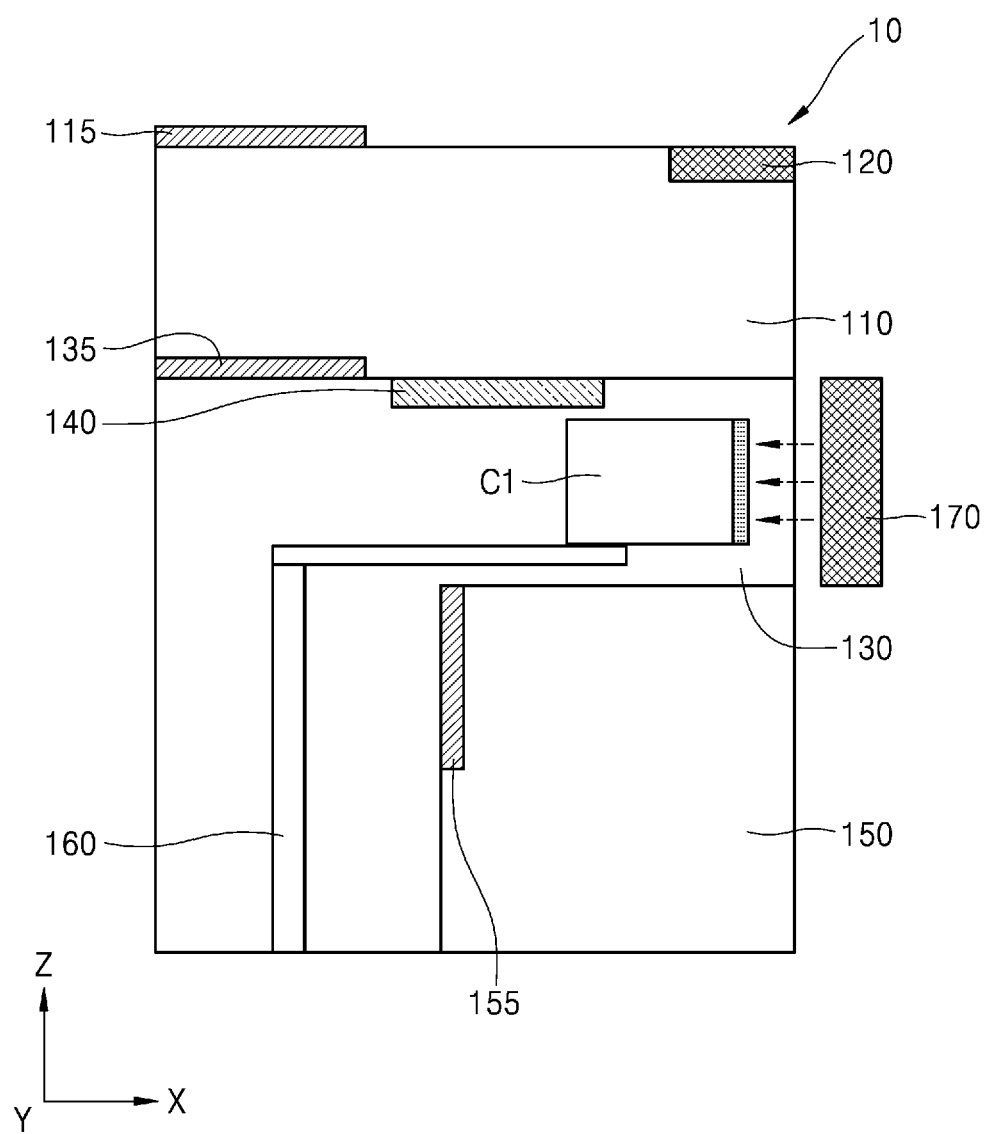
FIG. 5E is a diagram illustrating a step of the wafer processing method according to the example embodiment of the present disclosure.

Referring to FIG. 5E, a wafer processing method according to an example embodiment of the present disclosure may include fixing the position of the first wafer carrier C1 and checking at least one of a number and a position of the first wafer in the first wafer carrier C1 using the first wafer mapping device 170 (S1500).

In an example embodiment, in step S1500, the first wafer carrier C1 may be fixed in the inner space of the first EFEM chamber 130 adjacent to the first wafer mapping device 170. In this case, the carrier door of the first wafer carrier C1 may face the first wafer mapping device 170.

In an example embodiment, in step S1500, after the position of the first wafer carrier C1 is fixed in the inner space of the first EFEM chamber 130, the carrier door of the first wafer carrier C1 may be opened to expose a plurality of first wafers in the first wafer carrier C1 to the inner space of the first EFEM chamber 130.

In an example embodiment, in step S1500, after the carrier door of the first wafer carrier C1 is opened, the first wafer mapping device 170 may identify at least one of the positions and the number of the plurality of first wafers in the first wafer carrier C1.

Figure 5F:
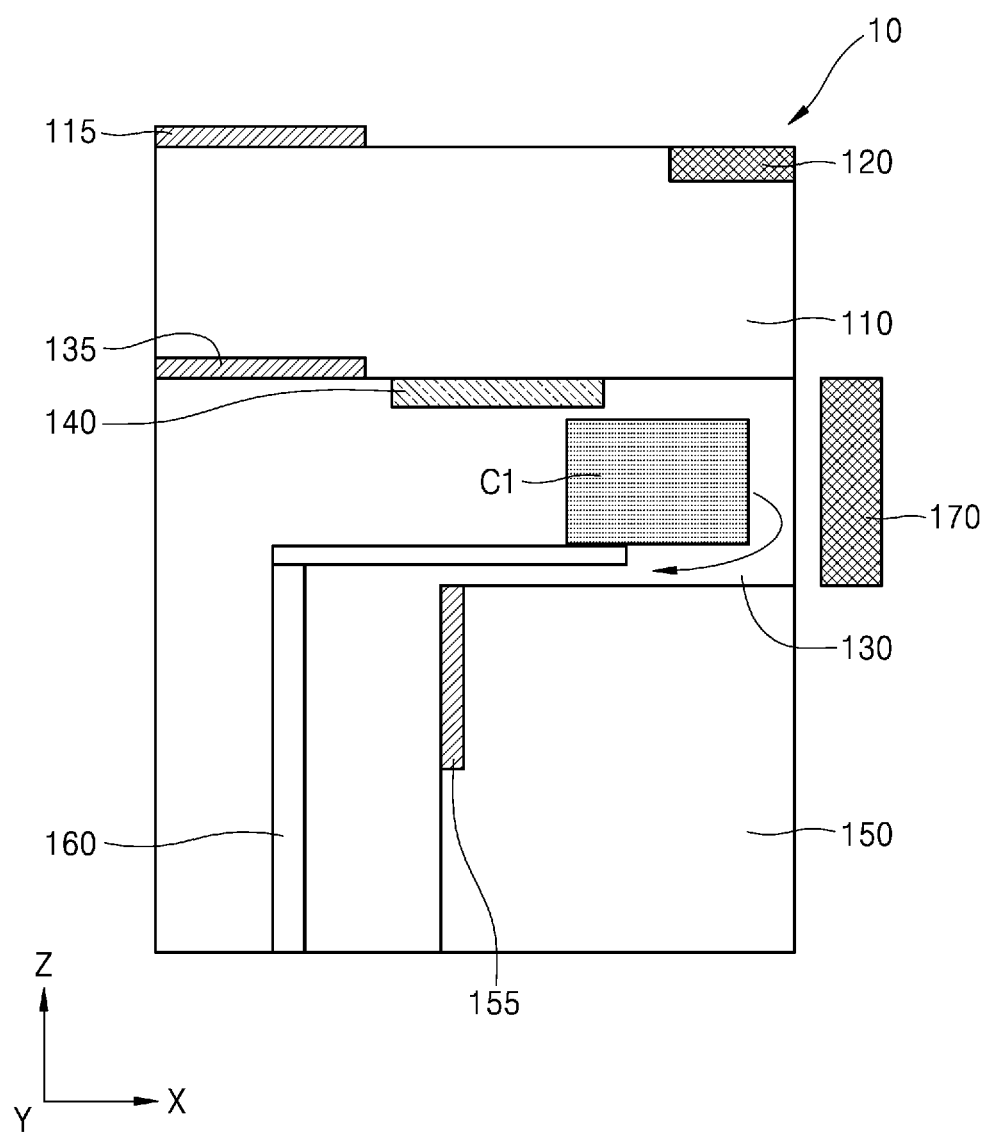
FIG. 5F is a diagram illustrating a step of the wafer processing method according to the example embodiment of the present disclosure.

Referring to FIG. 5F, a wafer processing method according to an example embodiment of the present disclosure may include rotating the first wafer carrier C1 (S1600).

In an example embodiment, in step S1600, the first wafer carrier C1 may be rotated 90 degrees. For example, in step S1600, the first wafer carrier C1 may be rotated 90 degrees so that the first wafer entrance of the first wafer carrier C1 faces the EFEM transfer chamber 40.

In an example embodiment, in step S1600, as the first EFEM arm 160 supporting the first wafer carrier C1 rotates by 90 degrees, the wafer entrance of the first wafer carrier C1 may face the EFEM transfer chamber 40.

Figure 5G:
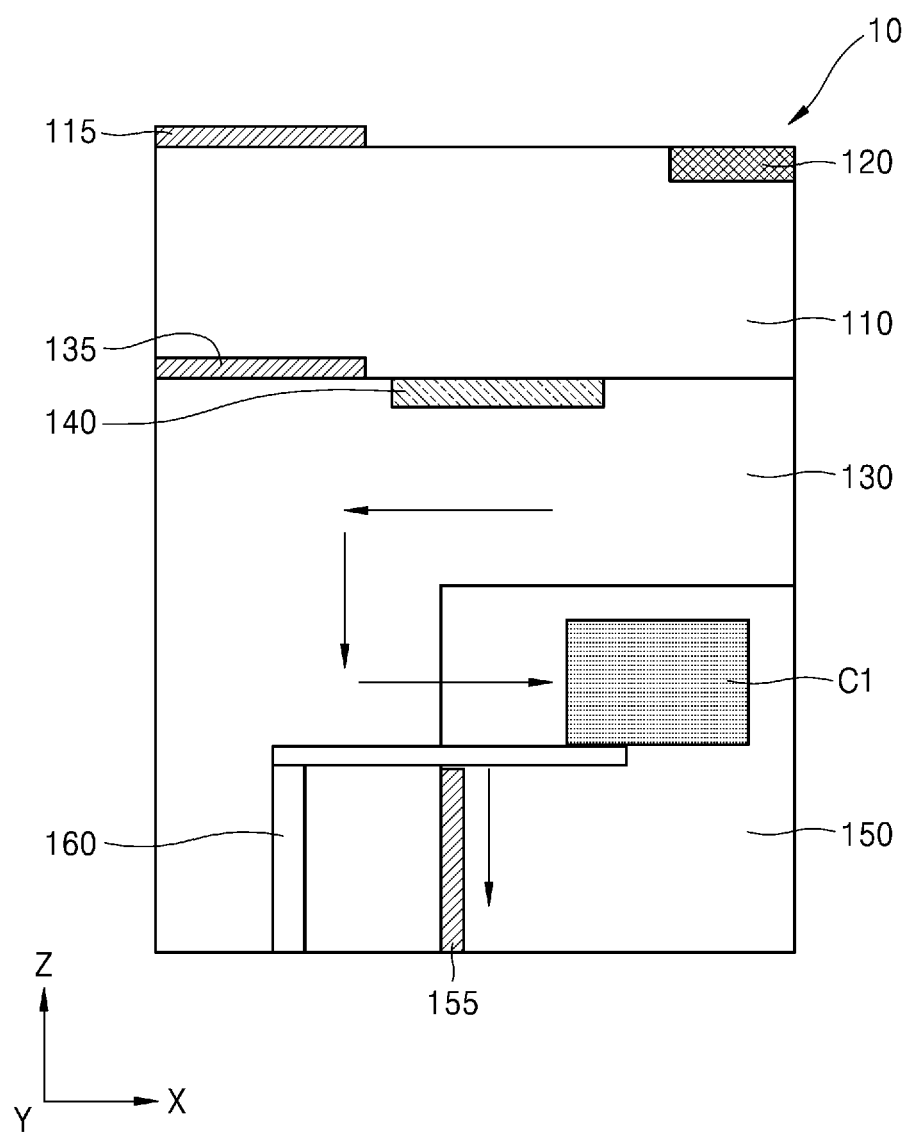
FIG. 5G is a diagram illustrating a step of the wafer processing method according to the example embodiment of the present disclosure.

Referring to FIG. 5G, the wafer processing method may include connecting the inner space of the first load lock 150 to the inner space of the first EFEM chamber 130, and putting the first wafer carrier C1 into the inner space of the first load lock 150 using the first EFEM arm 160 (S1700).

In an example embodiment, in step S1700, the first load lock door 155 may be opened, so the inner space of the first load lock 150 may be connected to the inner space of the first EFEM chamber 130.

In an example embodiment, in step S1700, after the inner space of the first load lock 150 and the inner space of the first EFEM chamber 130 are connected to each other, the first EFEM arm 160 may unload the first wafer carrier C1 from the first EFEM chamber 130 and put the first wafer carrier C1 into the inner space of the first load lock 150.

Figure 5H:
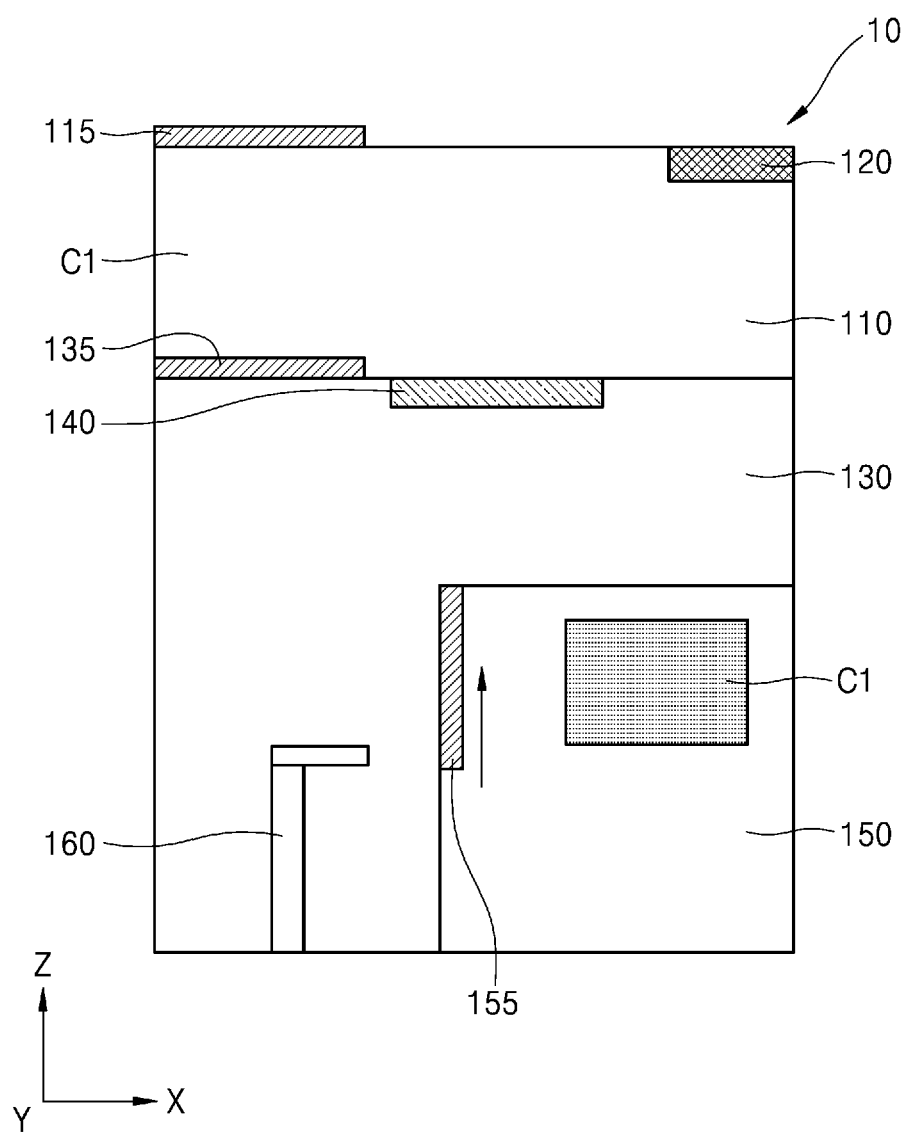
FIG. 5H is a diagram illustrating a step of the wafer processing method according to an example embodiment of the present disclosure.

Referring to FIG. 5H, a wafer processing method according to an example embodiment of the present disclosure may include blocking (or closing) the inner space of the first load lock 150 and forming a vacuum pressure in the inner space of the first load lock 150 (S1800).

In an example embodiment, in step S1800, the first load lock door 155 may be closed to seal the inner space of the first load lock 150. Also, when the inner space of the first load lock 150 is sealed, the pressure of the inner space of the first load lock 150 may be controlled as a vacuum pressure.

Accordingly, the pressure around the first wafer carrier C1 inside the inner space of the first load lock 150 may be the vacuum pressure.

In addition, the wafer processing method according to the example embodiment of the present disclosure may include taking out the first wafer from the first wafer carrier C1 inside the first load lock 150 using a wafer transfer arm 50 (refer to FIG. 1), putting the first wafer into at least one of a plurality of a wafer processing chamber (refer to FIG. 1) using the wafer transfer arm 50, and processing the first wafer inside the at least one of the wafer processing chamber 60.

Also, additionally, a wafer processing method according to an example embodiment of the present disclosure may further include taking out the processed first wafer from the wafer processing chamber 60 using the wafer transfer arm 50 to put into the first wafer carrier C1 inside the first load lock 150, controlling the internal pressure of the first load lock 150 to be substantially the same as or similar to the internal pressure of the first EFEM chamber 130, opening the first load lock door 155 so that the inner space of the first load lock 150 communicates with the inner space of the first EFEM chamber 130, taking out the first wafer carrier C1 from the first load lock 150 using the first EFEM arm 160 to put the first wafer carrier C1 into the first EFEM chamber 130, taking out the first wafer carrier C1 from the first EFEM chamber 130 using the first EFEM arm 160 to put the first wafer carrier C1 into the first atmosphere control chamber 110, and collecting the first wafer carrier C1 from the first atmosphere control chamber 110 using the wafer carrier transfer apparatus 30.

Figure 6:
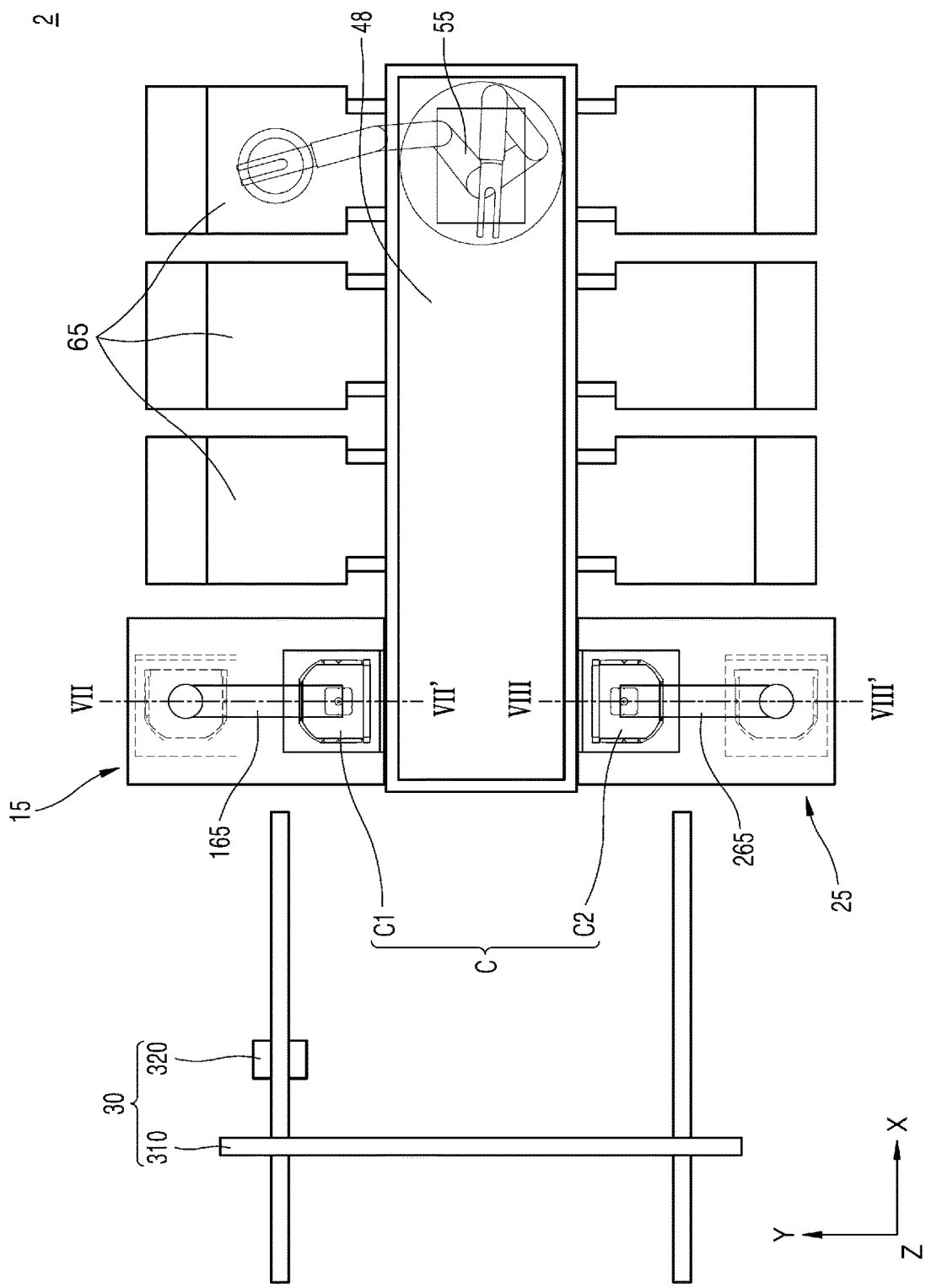
FIG. 6 is a cross-sectional view of a wafer processing apparatus according to an example embodiment of the present disclosure.

FIG. 6 is a cross-sectional view of a wafer processing apparatus 2 according to an example embodiment of the present disclosure. Also, FIG. 7 is a cross-sectional view of a region indicated by VII-VII' in FIG. 6, and FIG. 8 is a cross-sectional view of a region indicated by VIII-VIII' in FIG. 6

Figure 7:
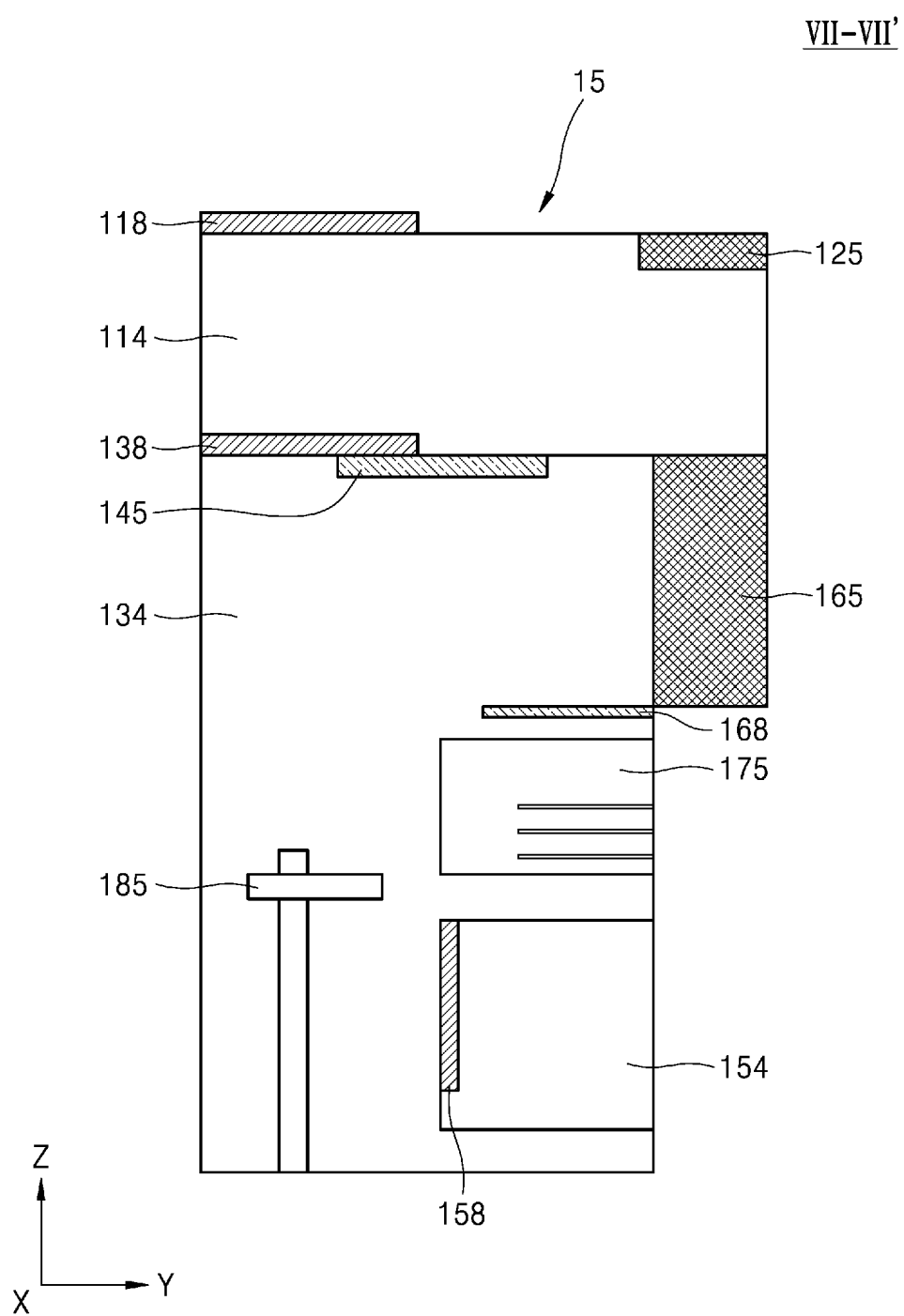
FIG. 7 is a cross-sectional view of a region indicated by VII-VII in FIG. 6.
Figure 8:
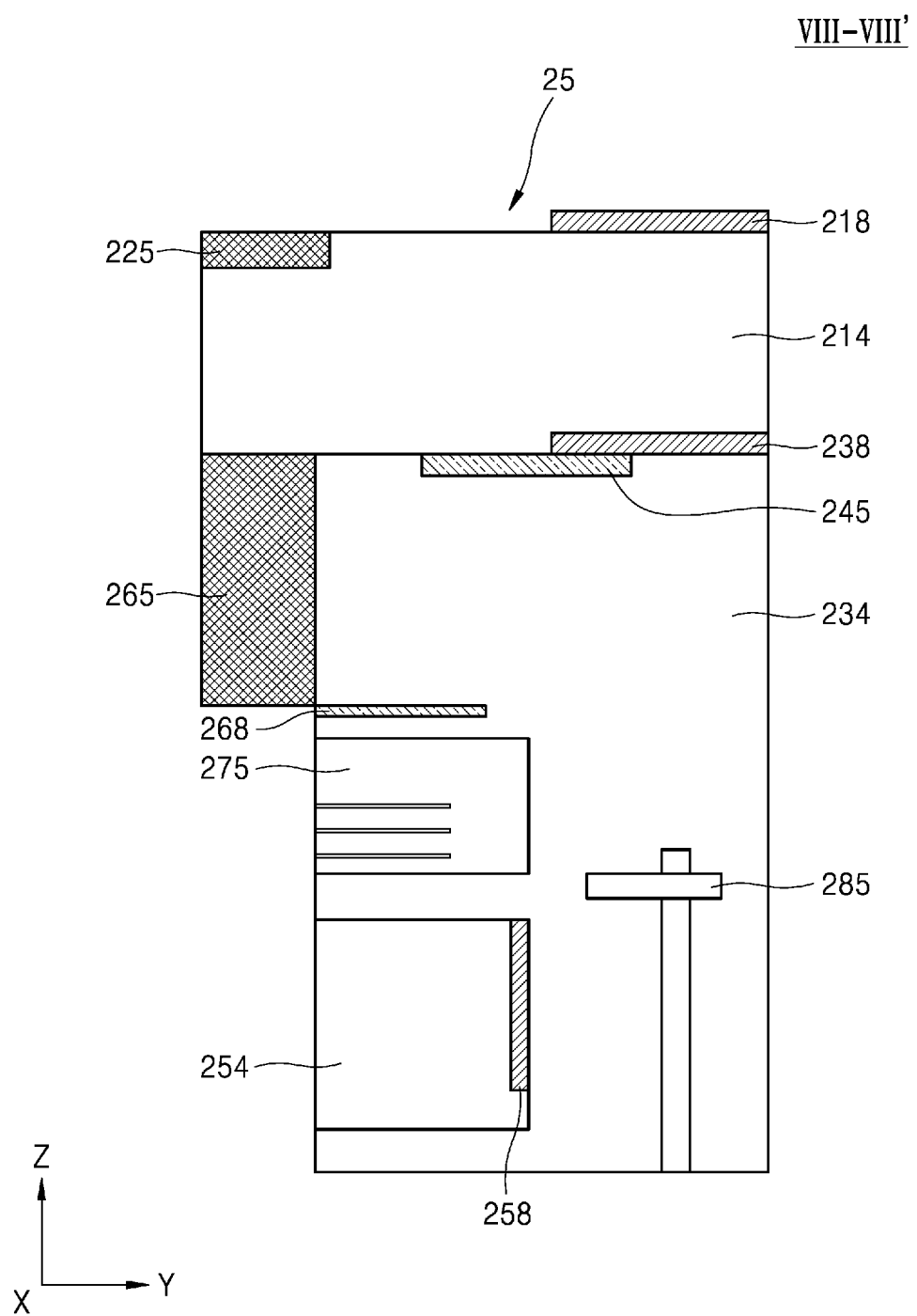
FIG. 8 is a cross-sectional view of a region indicated by VIII-VIII in FIG. 6.

Referring to FIGS. 6 to 8, a wafer processing apparatus 2 according to an example embodiment of the present disclosure may include a wafer carrier transfer apparatus 30, a first EFEM 15, a second EFEM 25, a wafer transfer chamber 48, a wafer transfer arm 55, a wafer processing chamber 65, and the like.

Hereinafter, in describing the wafer processing apparatus 2 of FIGS. 6 to 8, the description already given in the wafer processing apparatus 1 of FIGS. 1 to 3 is omitted, and differences from the wafer processing apparatus 1 of FIGS. 1 to 3 are mainly described.

The wafer carrier transfer apparatus 30 may transfer the wafer carrier C to the first EFEM 15 and the second EFEM 25 to perform a wafer processing process. In addition, the wafer carrier transfer apparatus 30 may receive the wafer carrier C for accommodating the wafer on which the wafer processing process has been performed, from the first EFEM 15 and the second EFEM 25, to transfer the wafer carrier C to a chamber for a subsequent process.

In an example embodiment, the wafer carrier transfer apparatus 30 may include a wafer carrier transfer line 310 and a wafer carrier transfer robot 320.

The first EFEM 15 may include a first atmosphere control chamber 114, a first atmosphere control chamber door 118, a first upper air supply device 125, a first EFEM chamber 134, a first EFEM chamber door 138, a first lower air supply device 145, a first load lock 154, a first load lock door 158, a first wafer mapping device 165, a first wafer carrier support 168, the first wafer aligner 175, and the first EFEM arm 185, and the like.

Hereinafter, some descriptions overlapped with the first EFEM 10 described with reference to FIGS. 1 to 3 are omitted, and differences therefrom are described.

In an example embodiment, the first wafer mapping device 165 may be on the side of the first EFEM chamber 134. Further, the first wafer mapping device 165 may be under the first atmosphere control chamber 114. The first wafer mapping device 165 may be configured to check at least one of a number and a position of the first wafer inside the first wafer carrier C1.

The first load lock 154 may be arranged to vertically overlapped by at least a portion of the first EFEM chamber 134. For example, the first load lock 154 may be disposed in the inner space of the first EFEM chamber 134.

In an example embodiment, the first load lock 154 may provide a space in which the first wafer taken out from the first wafer carrier C1 is disposed, and spatially connect the first EFEM chamber 134 and the wafer transfer chamber 40 to each other.

The first wafer carrier support 168 may be configured to support the first wafer carrier C1 inside the first EFEM chamber 134. In an example embodiment, the first wafer carrier support 168 may support a first wafer carrier C1 on which the mapping by the first wafer mapping device 165 is performed. For example, the first wafer carrier support 168 may be a shelf or a table extending in a horizontal direction from the inner surface of the first EFEM chamber 134 on which the first wafer mapping device 165 is mounted.

In an example embodiment, the first wafer aligner 175 may be arranged to be vertically overlapped by at least a portion of the first EFEM chamber 134. For example, the first wafer aligner 175 may be disposed in the inner space of the first EFEM chamber 134.

Further, the first wafer aligner 175 may be arranged so as to overlap the first load lock 154 in the vertical direction. For example, the first wafer aligner 175 may be provided under the first wafer carrier support 168. For example, the first wafer aligner 175 may be on the first load lock 154 to vertically overlap the first load lock 154.

In an example embodiment, the first wafer aligner 175 may accommodate the first wafer taken out from the first wafer carrier C1 seated on the first wafer carrier support 168. Further, the first wafer aligner 175 may be configured to align the first wafer.

For example, the first wafer aligner 175 may include a spinner configured to rotate the first wafer such that the first wafer faces a preset orientation. In detail, the first wafer aligner 175 may be configured to sense a notch formed in the first wafer and rotate the first wafer based on the sensed position of the notch.

The first EFEM arm 185 may be configured to move inside the first EFEM chamber 130 to transfer at least one of the first wafer carrier C1 and the first wafer. In an example embodiment, the first EFEM arm 185 may include a first robotic arm configured to handle the first wafer carrier C1 and may include a second robotic arm configured to handle the first wafer. However, embodiments of the present disclosure are not limited thereto, and the first EFEM arm 185 may include one robot arm configured to handle both the first wafer carrier C1 and the first wafer.

The first EFEM arm 185 may be configured to move inside the first EFEM chamber 130 to transfer the first wafer carrier C1. In an example embodiment, the first EFEM arm 160 may unload the first wafer carrier C1 from the first atmosphere control chamber 110 to put the first wafer carrier C1 into the first EFEM chamber 130, or may place the first wafer carrier C1 on the first wafer carrier support 168.

Further, the first EFEM arm 180 may unload the first wafer from the first wafer carrier C1 seated on the first wafer carrier support 168 to put the first wafer into at least one of the first load lock 154 and the first wafer aligner 175.

For example, the first EFEM arm 180 may unload the first wafer from the first wafer carrier C1 seated on the first wafer carrier support 168 to put the first wafer into the first wafer aligner 175. Further, the first EFEM arm 180 may unload the first wafer aligned by the first wafer aligner 175 from the first wafer aligner 175 to put the first wafer into the first load lock 154.

The second EFEM 25 may include a first atmosphere control chamber 214, a second atmosphere control chamber door 218, a second upper air supply device 225, a second EFEM chamber 234, a second EFEM chamber door 238, a second lower air supply device 245, a second load lock 254, a second load lock door 258, a second wafer mapping device 265, a second wafer carrier support 268, a second wafer aligner 275, a second EFEM arm 285, and the like.

Because the description of the second EFEM 25 overlaps the description of the above-described first EFEM 15, a detailed description thereof is omitted.

The wafer transfer arm 55 may move in a horizontal direction (e.g., an X direction) inside the wafer transfer chamber 48, and unload the first wafer in the first load lock 154 of the first EFEM 15 and the second wafer in the second load lock 254 of the second EFEM 25 to put the first wafer and the second wafer into the wafer processing chamber 65.

Further, the wafer transfer arm 55 may be configured to unload a wafer processed in the wafer processing chamber 65 to put the processed wafer into the first load lock 154 and the second load lock 254 of the first EFEM 10.

Each of the first load lock 154 and the second load lock 254 of the wafer processing apparatus 2 of embodiments of the present disclosure may be arranged to be vertically overlapped by the first EFEM chamber 134 and the second EFEM chamber 234, and each of the first wafer aligner 175 and the second wafer aligner 275 may be arranged to vertically overlapped by the first EFEM chamber 134 and the second EFEM chamber 234.

Accordingly, the size of the wafer processing apparatus 2 of the embodiment of the present disclosure may be reduced, and the wafer processing efficiency per unit area of the wafer processing apparatus 2 may be improved.

Figure 9:
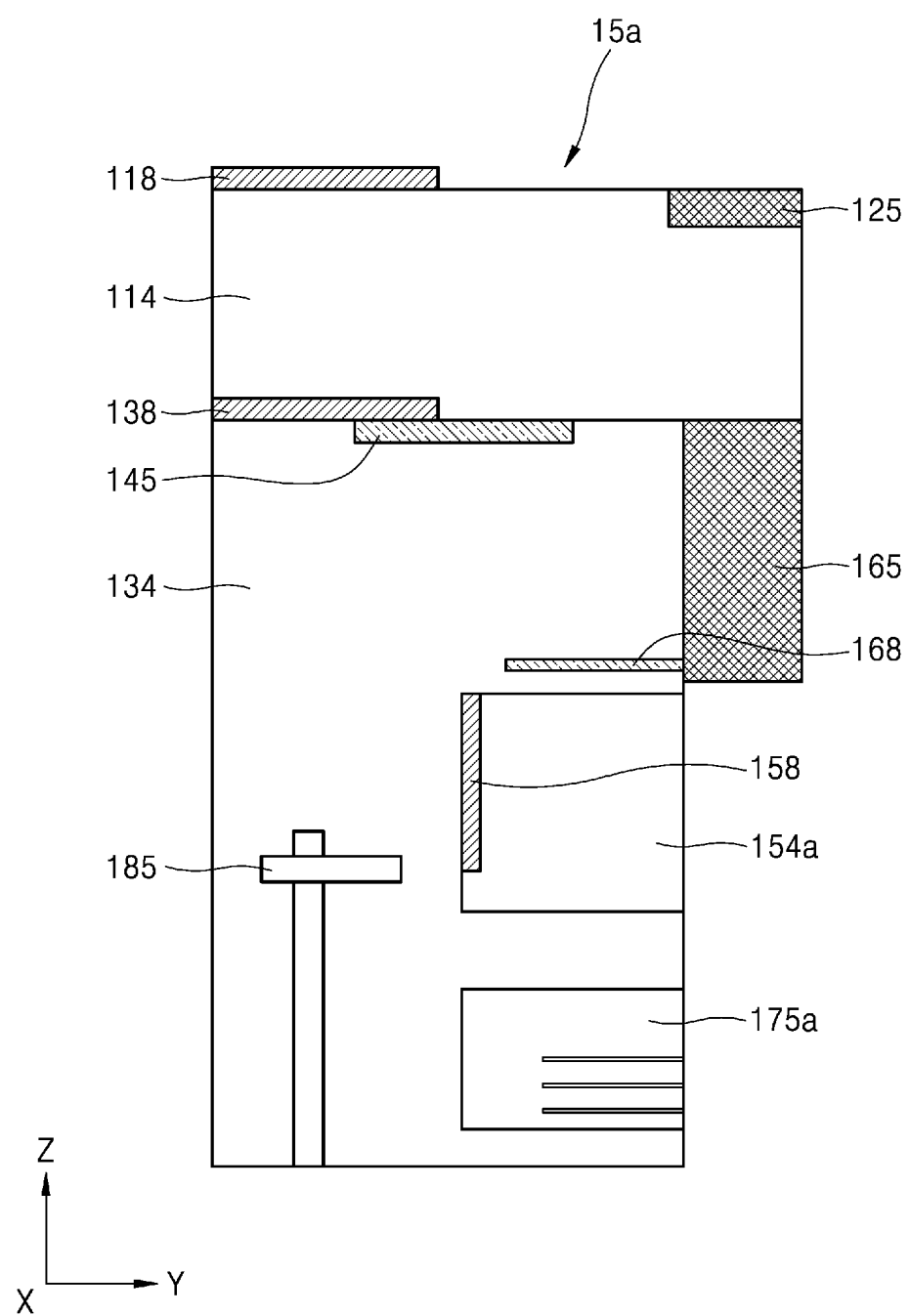
FIG. 9 is a cross-sectional view of a first EFEM according to an example embodiment of the present disclosure.

FIG. 9 is a cross-sectional view of the first EFEM 15a according to an example embodiment of the present disclosure.

Hereinafter, in the description of the first EFEM 15a of FIG. 9, description already given in the description of the first EFEM 15 of FIG. 7 is omitted, and differences therefrom will be described.

Referring to FIG. 9, the first wafer aligner 175a of the first EFEM 15a may be arranged to be vertically overlapped by the first load lock 154a. For example, the first wafer aligner 175a may be under the first load lock 154a to be vertically overlapped by the first load lock 154a.

FIGS. 10A to 10K are diagrams illustrating each step of a wafer processing method according to an example embodiment of the present disclosure. In detail, a wafer processing method according to an example embodiment of the present disclosure may be a wafer processing method using the wafer processing apparatus 2 in FIGS. 6 to 8.

Figure 10A:
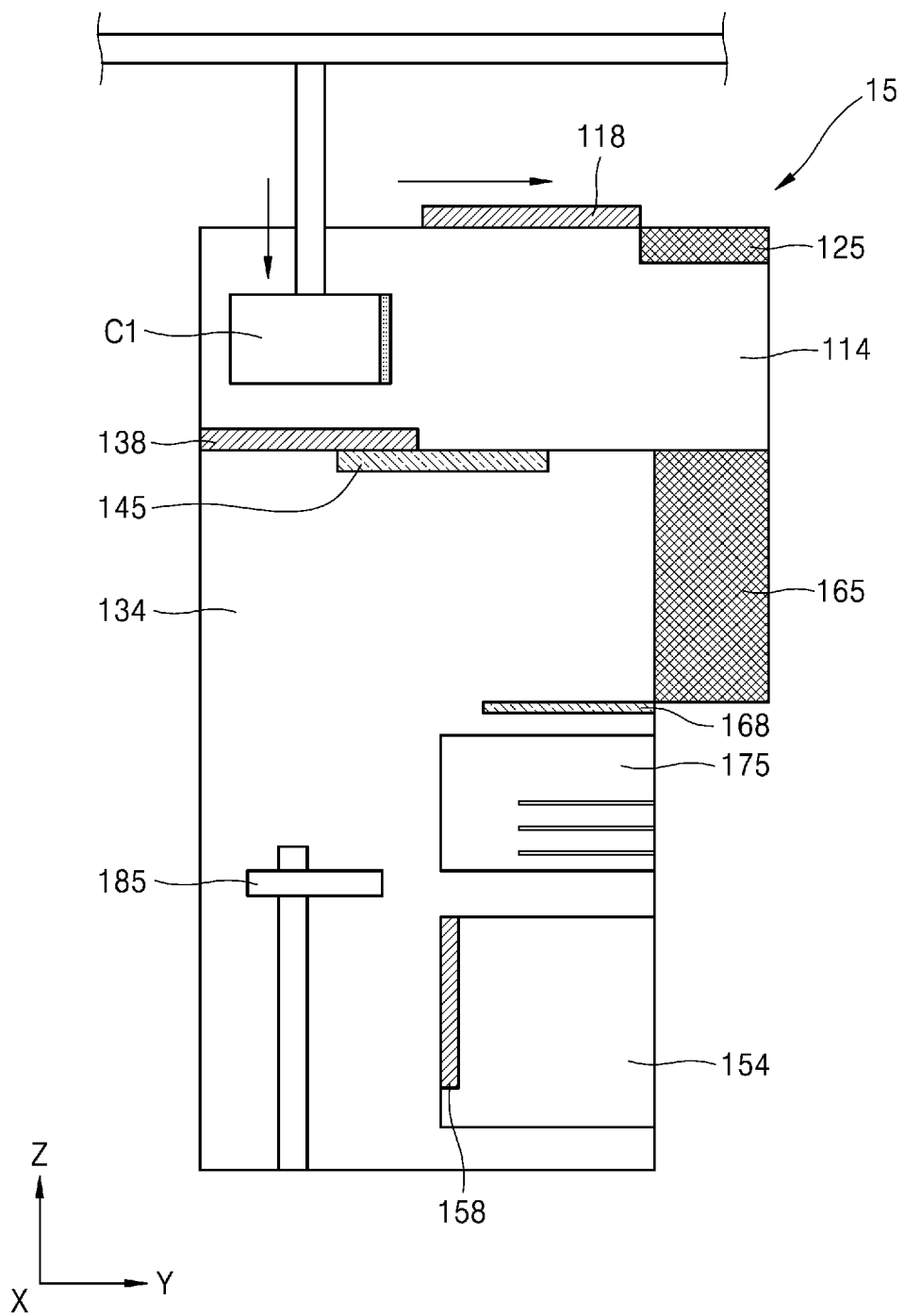
FIG. 10A is a diagram illustrating a step of a wafer processing method according to an example embodiment of the present disclosure.

Referring to FIG. 10A, a wafer processing method according to an example embodiment of the present disclosure may include arranging the first wafer carrier C1 accommodating the first wafer in the first atmosphere control chamber 114 arranged on the first EFEM chamber 134 (S2100).

In an example embodiment, in step S2100, the first atmosphere control chamber door 118 may open the opening of the first atmosphere control chamber 114. Further, the wafer carrier transfer apparatus 30 may input the first wafer carrier C1 into the inner space of the first atmosphere control chamber 114.

Figure 10B:
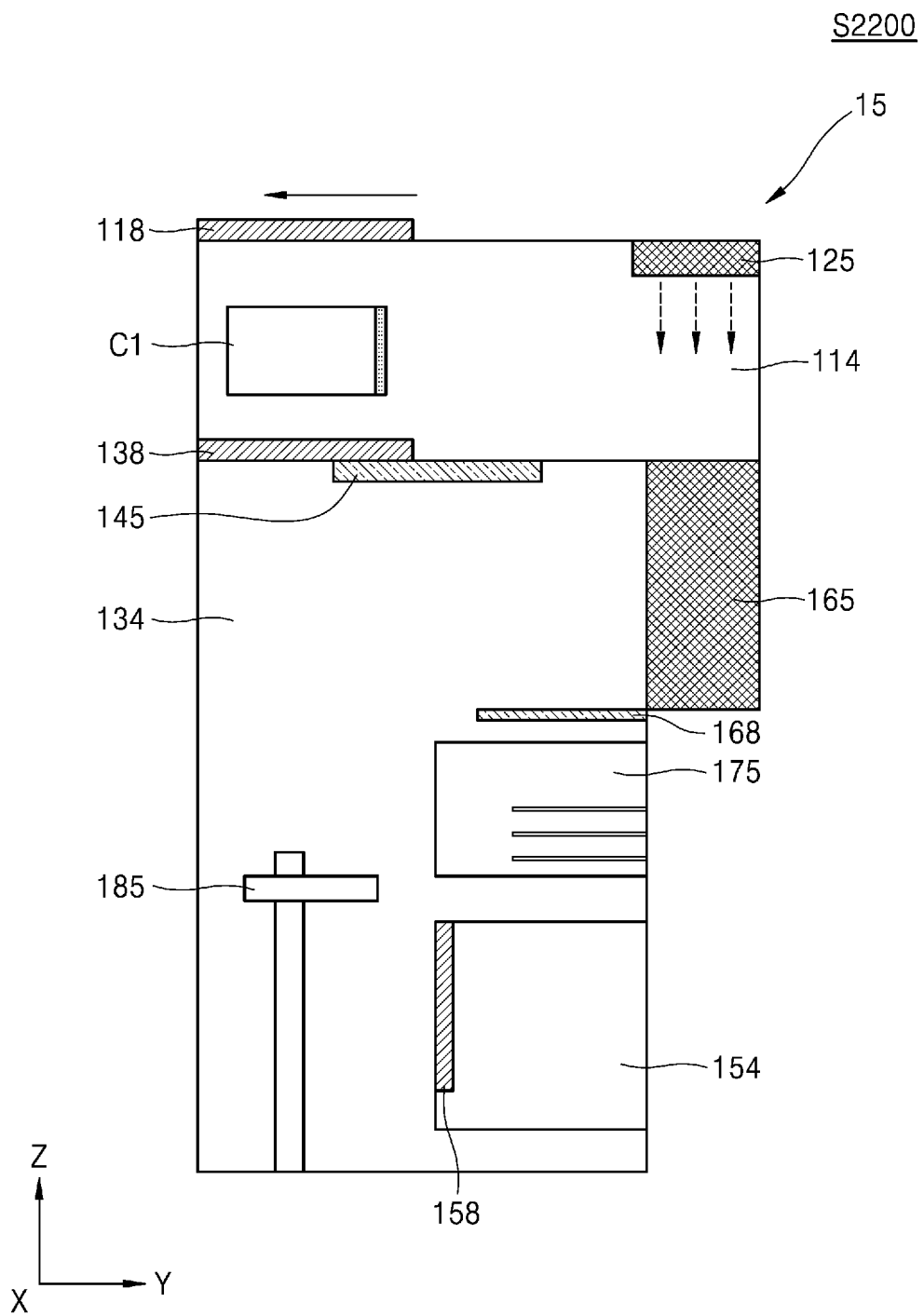
FIG. 10B is a diagram illustrating a step of the wafer processing method according to the example embodiment of the present disclosure.

Referring to FIG. 10B, a wafer processing method according to an example embodiment of the present disclosure may include blocking the inner space of the first atmosphere control chamber 114 and controlling the atmosphere of the inner space of the first atmosphere control chamber 114 to be substantially the same as or similar to the atmosphere of the inner space of the first EFEM chamber 134 (S2200).

In an example embodiment, in step S2200, after the first wafer carrier C1 is put into the inner space of the first atmosphere control chamber 114, the first atmosphere control chamber door 118 may block or close the opening of the first atmosphere control chamber 114.

In an example embodiment, in step S2200, after the first atmosphere control chamber door 118 is closed, the atmosphere of the inner space of the first atmosphere control chamber 114 may be controlled to be substantially the same as or similar to the atmosphere of the first EFEM chamber 134. For example, at least one of humidity, temperature, and pressure of the inner space of the first atmosphere control chamber 114 may be controlled to be the same as or similar to the humidity, temperature, and pressure of the inner space of the first EFEM chamber 134.

In an example embodiment, in step S2200, the first upper air supply device 125 may be configured to suck air from the inner space of the first EFEM chamber 134 to discharge the air into the inner space of the first atmosphere control chamber 114. For example, the first upper air supply device 125 may suck air from the inner space of the first EFEM chamber 134 through a duct connected to the inner space of the first EFEM chamber 134 and discharge the sucked air to the inner space of the first atmosphere control chamber 114. Accordingly, the humidity of the first atmosphere control chamber 114 may be substantially the same as or similar to the humidity of the inner space of the first EFEM chamber 134.

Figure 10C:
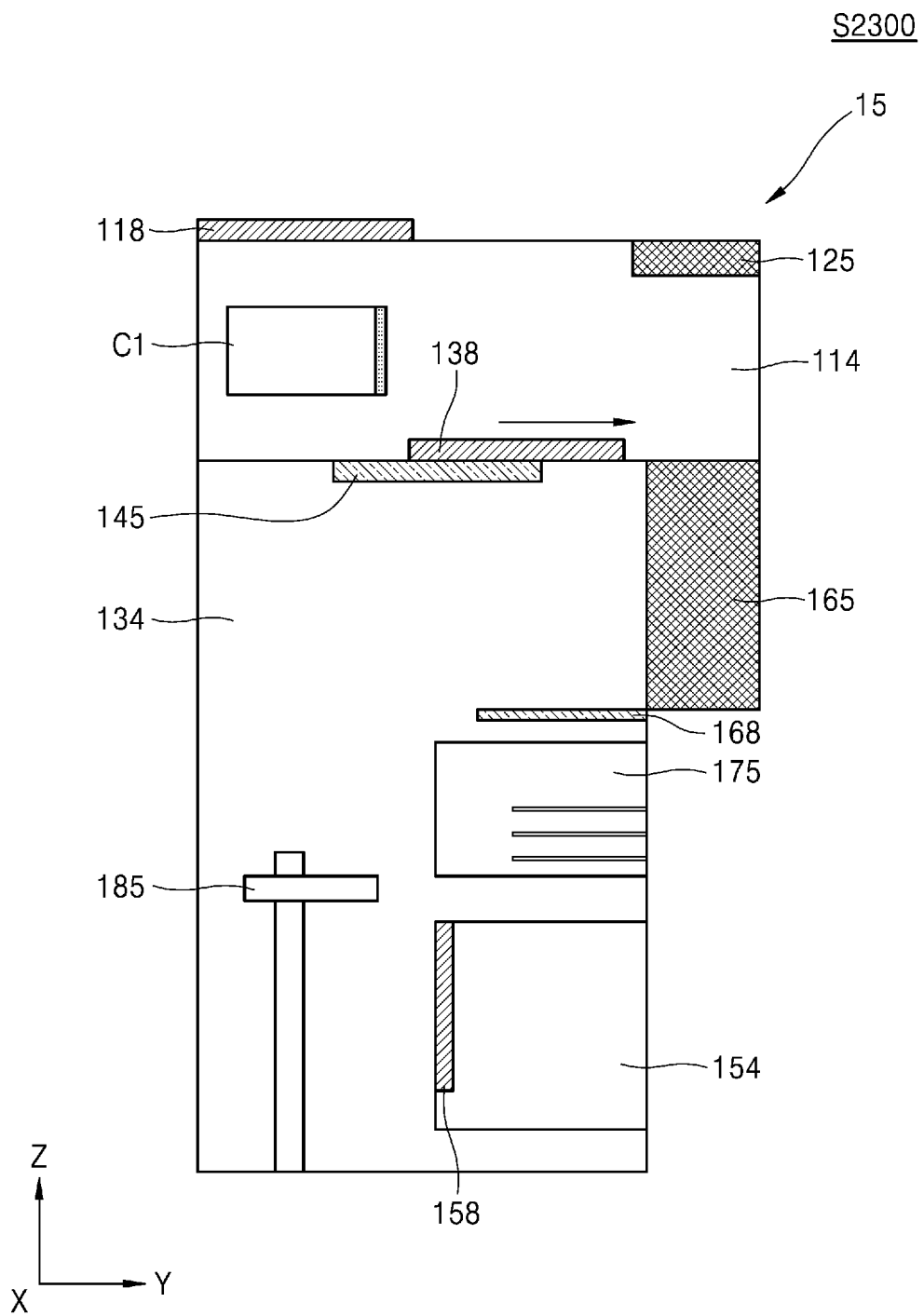
FIG. 10C is a diagram illustrating a step of the wafer processing method according to the example embodiment of the present disclosure.

Referring to FIG. 10C, a wafer processing method according to an example embodiment of the present disclosure may include connecting the inner space of the first atmosphere control chamber 114 and the inner space of the first EFEM chamber 134 to each other (S2300).

In an example embodiment, in step S2300, the first EFEM chamber door 138 is opened, so the inner space of the first atmosphere control chamber 114 and the inner space of the first EFEM chamber 134 may be connected to each other.

The atmosphere of the inner space of the first EFEM chamber 134 may be controlled to be substantially the same as the atmosphere of the inner space of the first atmosphere control chamber 114 through the execution of step S2200 described above, so physical damage to the first wafer inside the first wafer carrier C1 in step S2300 may be prevented.

Figure 10D:
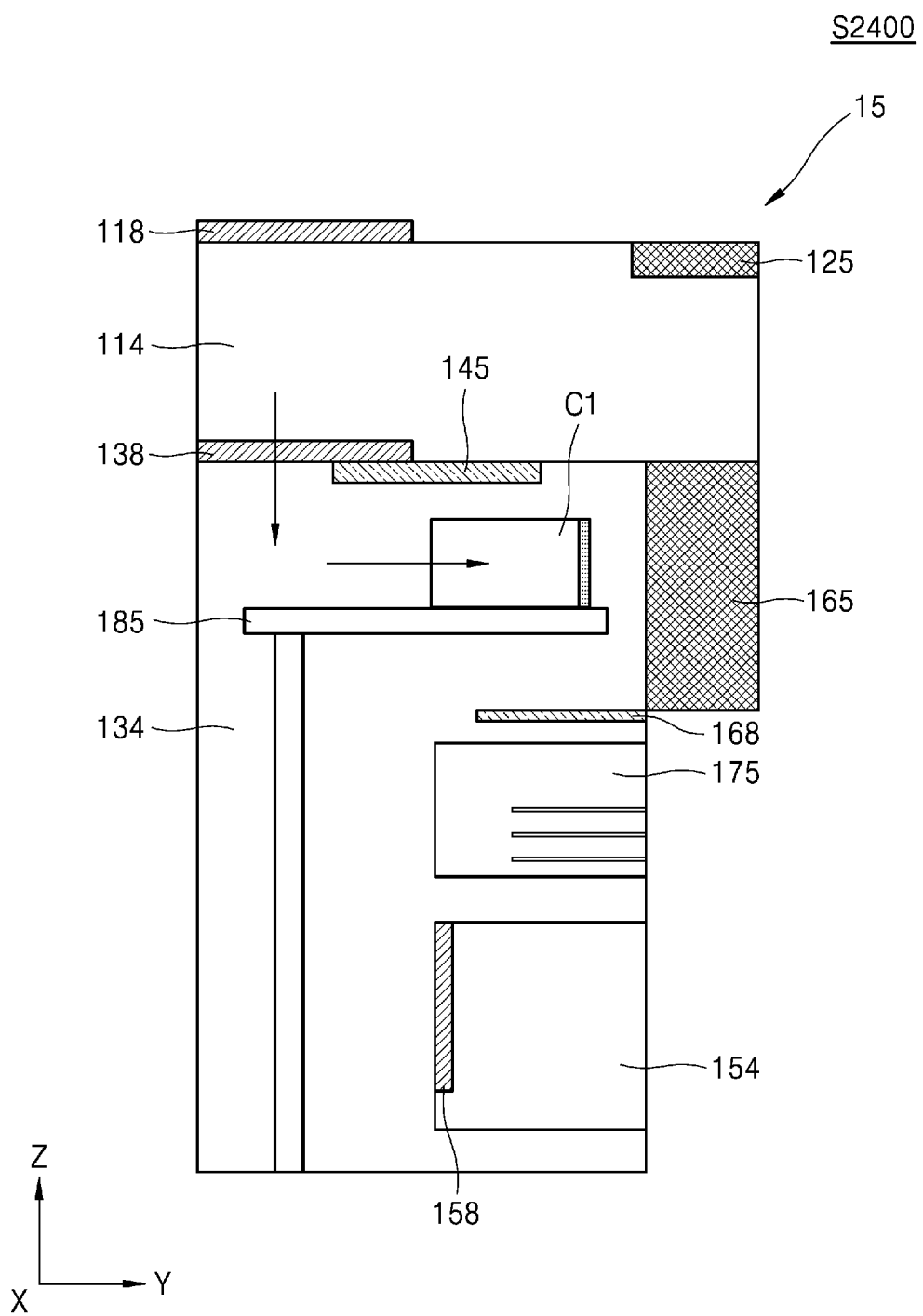
FIG. 10D is a diagram illustrating a step of the wafer processing method according to the example embodiment of the present disclosure.

Referring to FIG. 10D, a wafer processing method according to an example embodiment of the present disclosure may include unloading the first wafer carrier C1 from the first atmosphere control chamber 114 by the first EFEM arm 185 moving in the inner space of the first EFEM chamber 134, and putting the first wafer carrier C1 into the first EFEM chamber 134 (S2400).

In an example embodiment, in step S2400, the first EFEM arm 185 may move in a horizontal direction inside the first EFEM chamber 134 to transfer the first wafer carrier C1 to the inner space of the first EFEM chamber 130 adjacent to the first wafer mapping device 165.

Figure 10E:
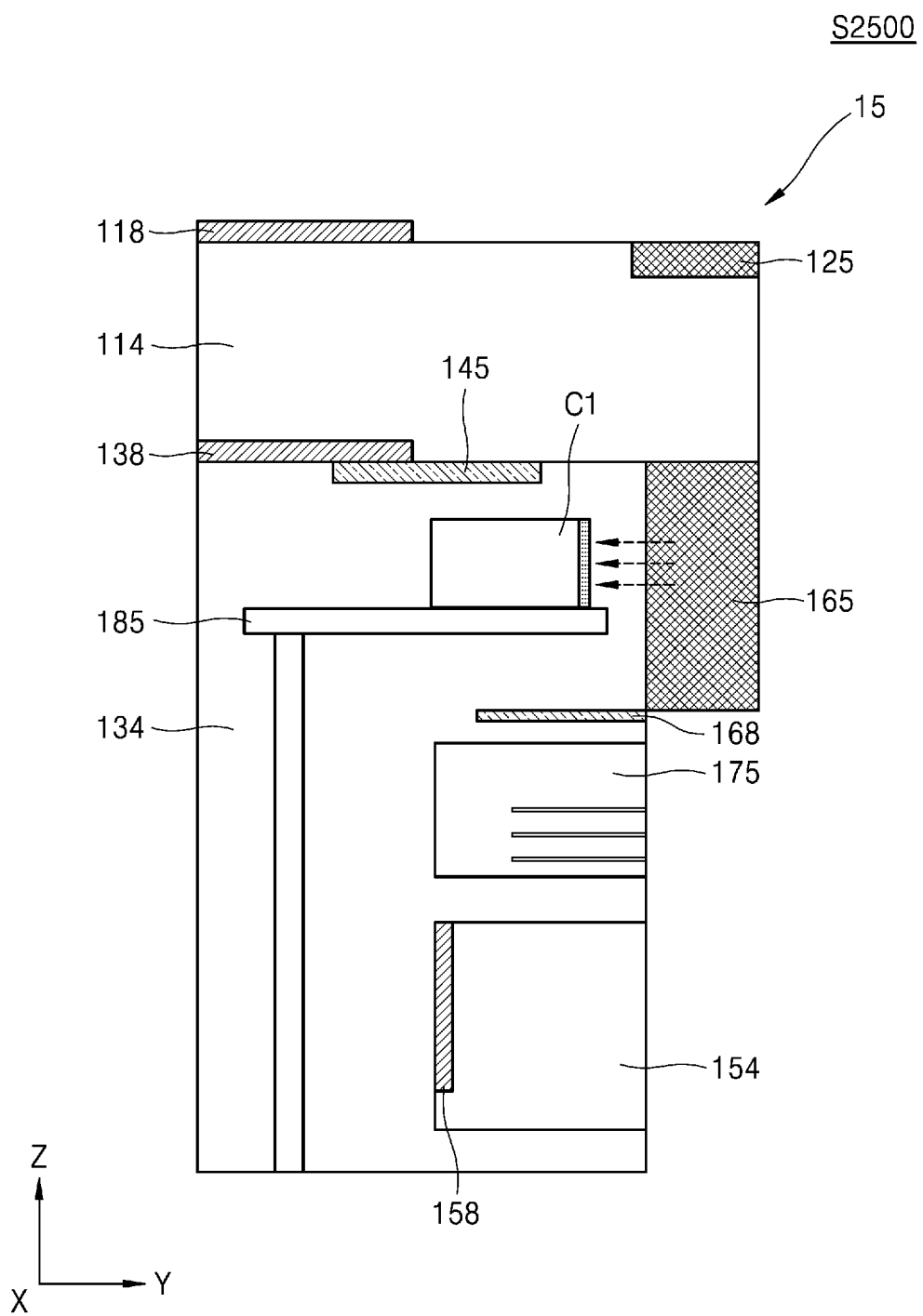
FIG. 10E is a diagram illustrating a step of the wafer processing method according to the example embodiment of the present disclosure.

Referring to FIG. 10E, a wafer processing method according to an example embodiment of the present disclosure may include fixing the position of the first wafer carrier C1 and checking at least one of a number and a position of first wafer in the first wafer carrier C1 by the first wafer mapping device 165 (S2500).

In an example embodiment, in step S2500, after the position of the first wafer carrier C1 is fixed in the inner space of the first EFEM chamber 134, a carrier door of the first wafer carrier C1 may be opened to expose a plurality of first wafers in the first wafer carrier C1 to an inner space of the first EFEM chamber 134.

In an example embodiment, in step S2500, after the carrier door of the first wafer carrier C1 is opened, the first wafer mapping device 165 may identify at least one of the positions and the number of the plurality of first wafers in the first wafer carrier C1.

Figure 10F:
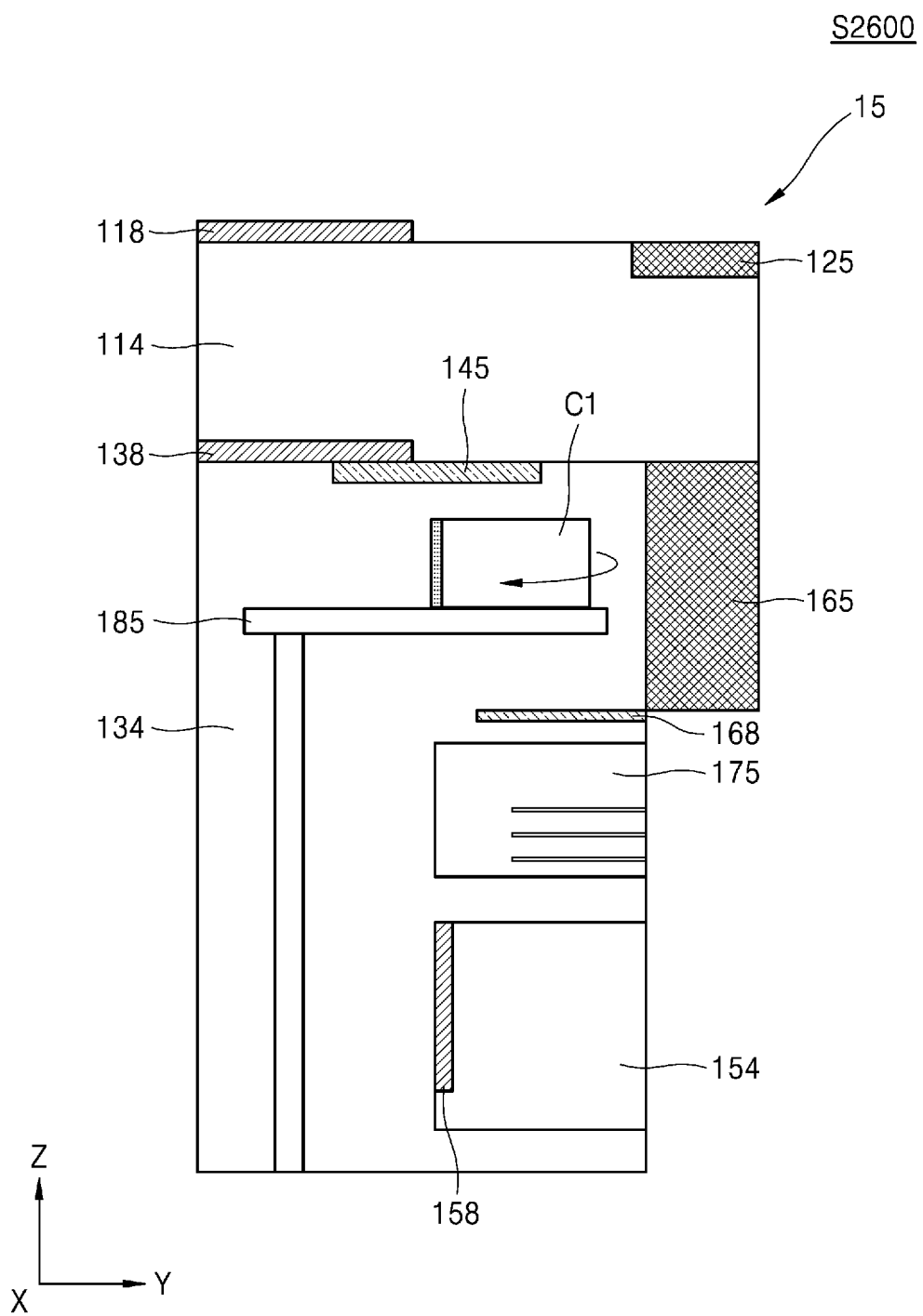
FIG. 10F is a diagram illustrating a step of the wafer processing method according to the example embodiment of the present disclosure.

Referring to FIG. 10F, a wafer processing method according to an example embodiment of the present disclosure may include rotating the first wafer carrier C1 (S2600).

In an example embodiment, in step S2600, the first wafer carrier C1 may be rotated 180 degrees. For example, in step S2600, the first wafer carrier C1 may be rotated 180 degrees so that the first wafer entrance of the first wafer carrier C1 face the same direction as the entrance of the first wafer aligner 175 and the entrance of the first load lock 154.

Figure 10G:
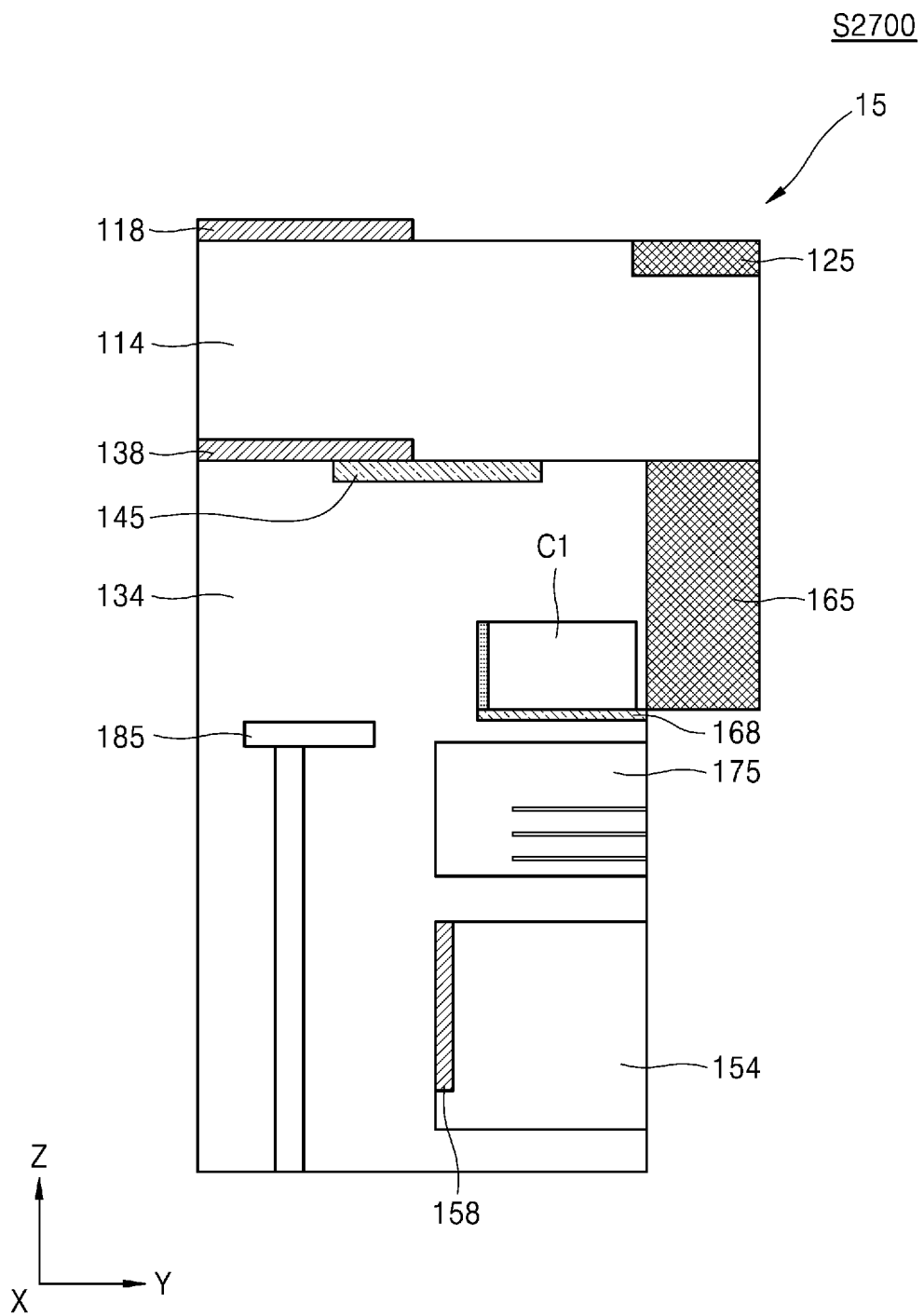
FIG. 10G is a diagram illustrating a step of the wafer processing method according to the example embodiment of the present disclosure.

Referring to FIG. 10G, a wafer processing method according to an example embodiment of the present disclosure may include placing the first wafer carrier C1 on the first wafer carrier support 168 (S2700).

In an example embodiment, in step S2700, the first EFEM arm 185 may transport the first wafer carrier C1 mapped by the first wafer mapping device 165 to the first wafer carrier support 168.

Figure 10H:
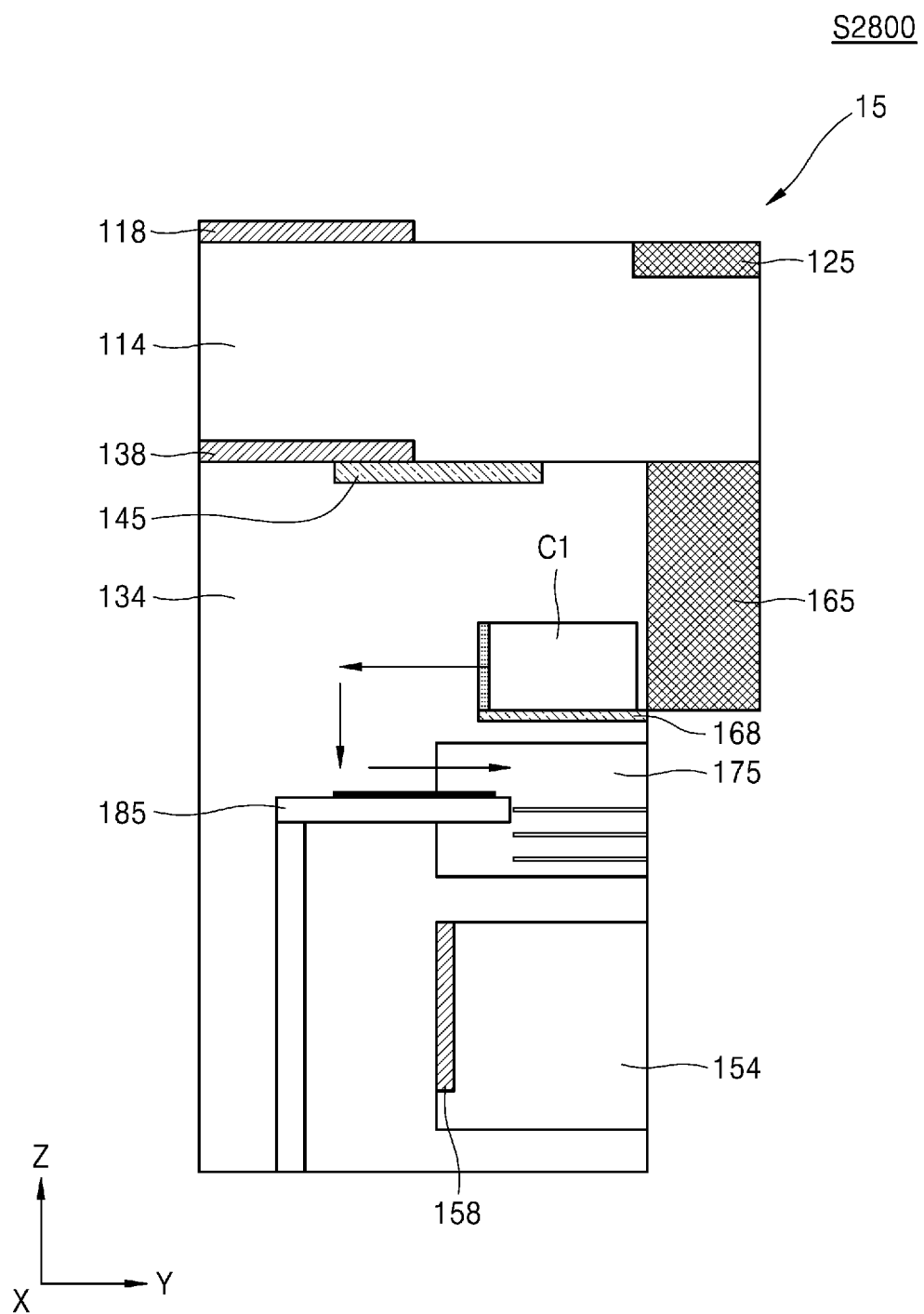
FIG. 10H is a diagram illustrating a step of the wafer processing method according to the example embodiment of the present disclosure.

Referring to FIG. 10H, a wafer processing method according to an example embodiment of the present disclosure may include unloading the first wafer from the first wafer carrier C1 seated on the first wafer carrier support 168 to put the first wafer into the first wafer aligner 175 (S2800).

In an example embodiment, in step S2800, the first EFEM arm 185 may unload the first wafer from the first wafer carrier C1 to put the first wafer into the first wafer aligner 175.

Figure 10I:
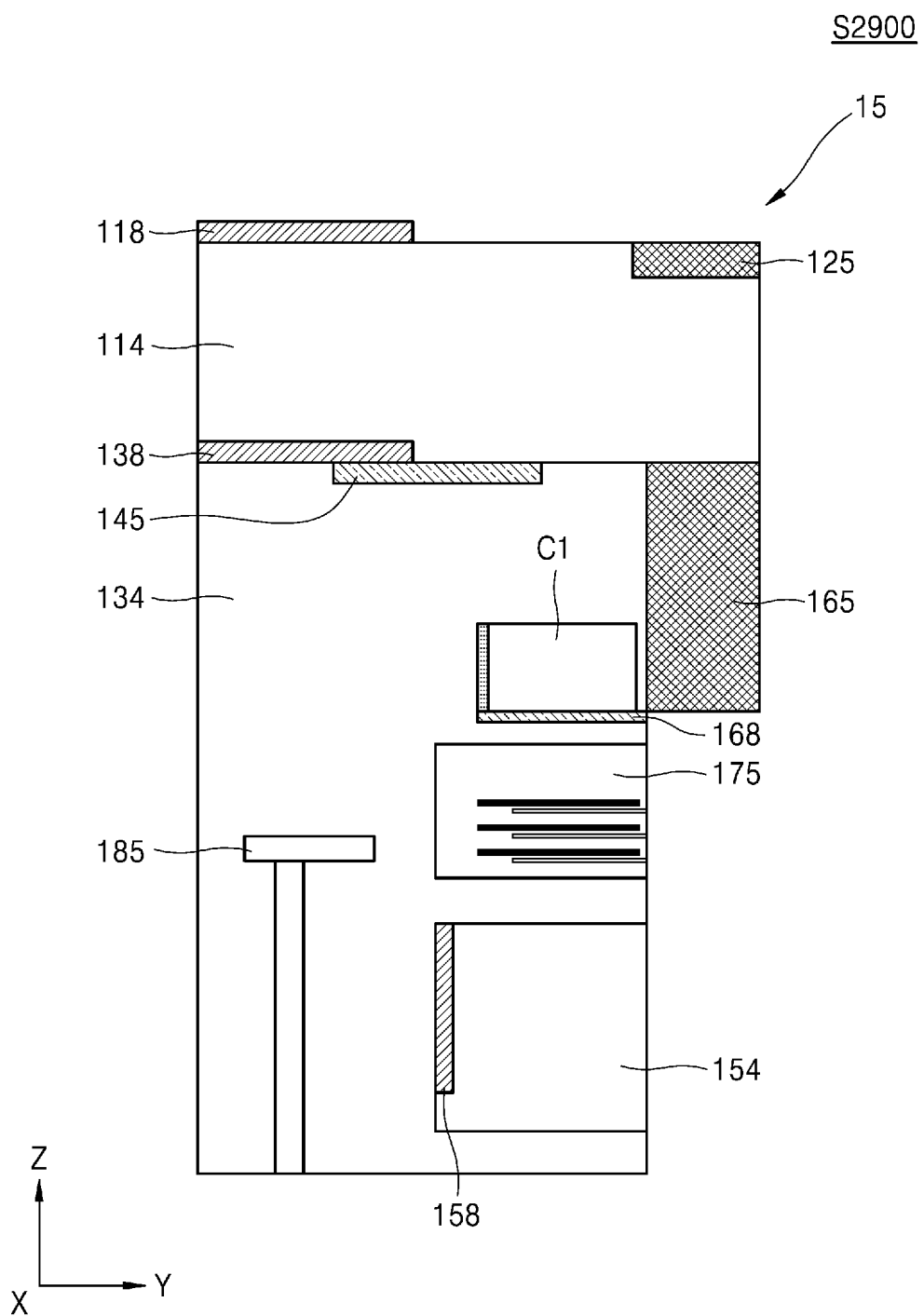
FIG. 10I is a diagram illustrating a step of the wafer processing method according to the example embodiment of the present disclosure.

Referring to FIG. 10I, a wafer processing method according to an example embodiment of the present disclosure may include aligning the first wafer using the first wafer aligner 175 (S2900).

In an example embodiment, in step S2900, the first wafer aligner 175 may rotate the first wafer so that the first wafer faces a preset direction. For example, the first wafer aligner 175 may sense the notch formed in the first wafer and rotate the first wafer based on the sensed position of the notch.

Figure 10J:
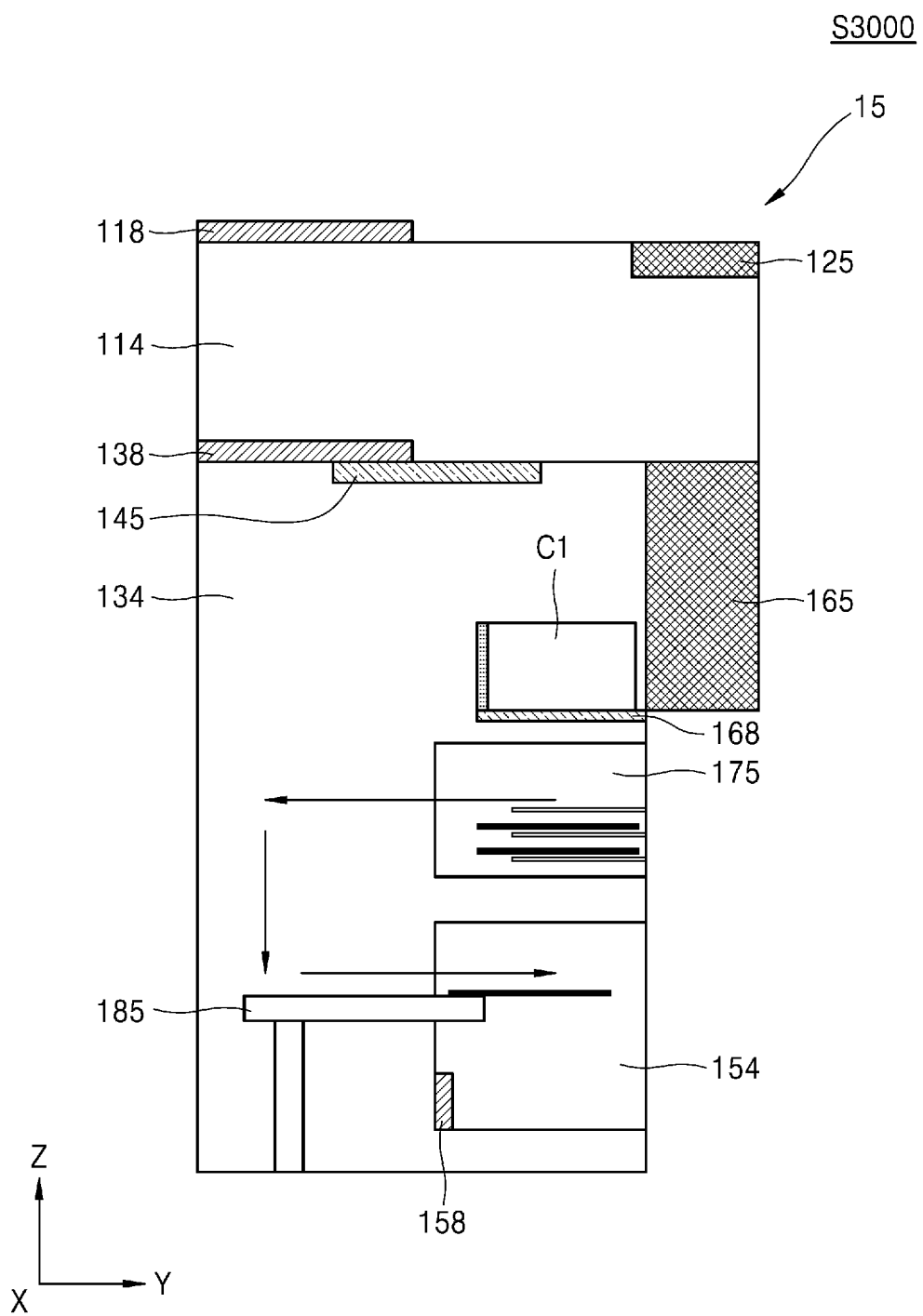
FIG. 10J is a diagram illustrating a step of the wafer processing method according to the example embodiment of the present disclosure.

Referring to FIG. 10J, a wafer processing method according to an example embodiment of the present disclosure may include unloading the first wafer from the first wafer aligner 175 to put the first wafer into the first load lock 154 (S3000).

In an example embodiment, in step S3000, the first EFEM arm 185 may unload the aligned first wafer from the first wafer aligner 175 to put the aligned first wafer into the first load lock 154.

Figure 10K:
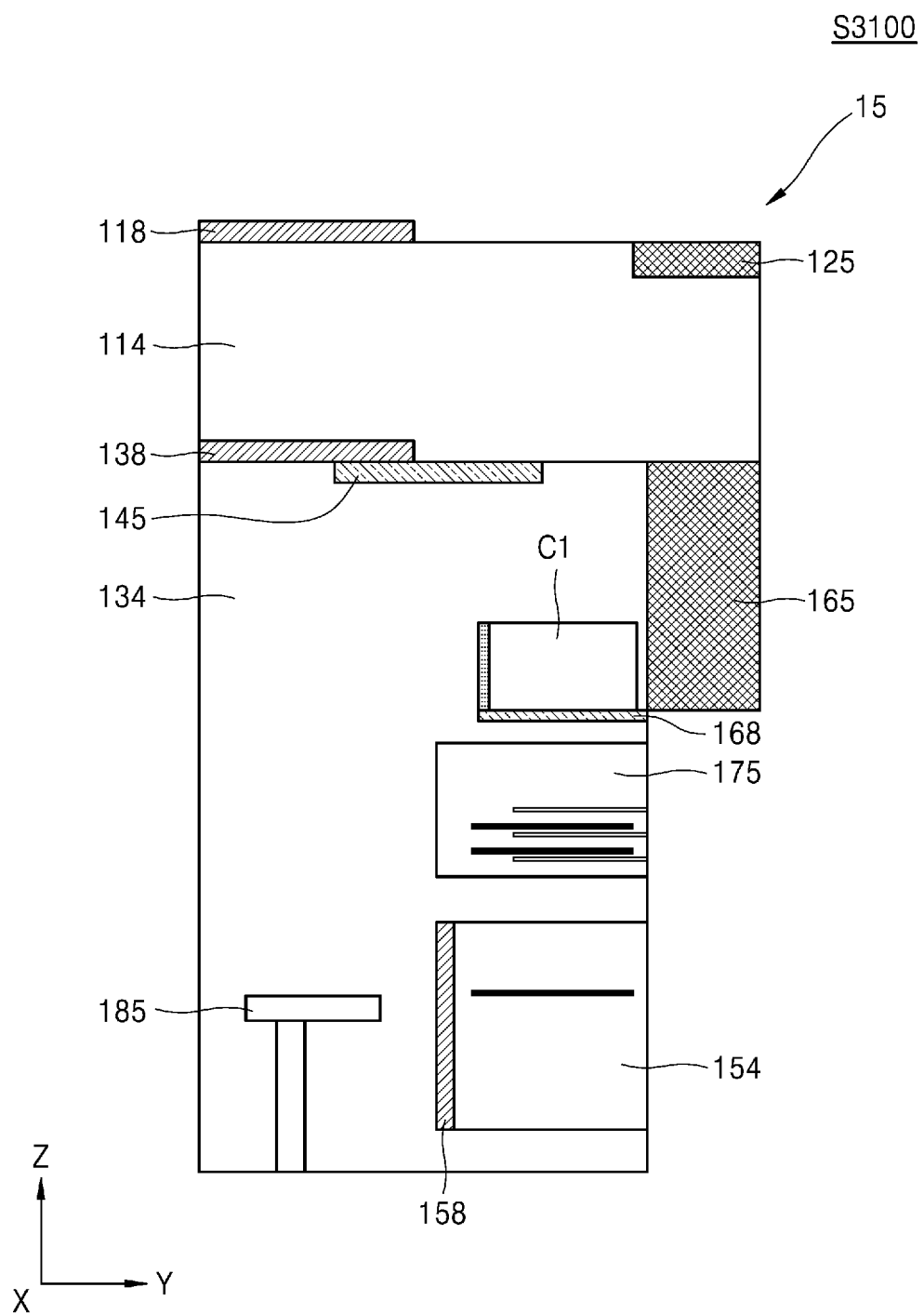
FIG. 10K is a diagram illustrating a step of the wafer processing method according to the example embodiment of the present disclosure.

Referring to FIG. 10K, a wafer processing method according to an example embodiment of the present disclosure may include blocking the inner space of the first load lock 154 and forming a vacuum pressure in the inner space of the first load lock 154 (S3100).

In an example embodiment, in step S3100, the first load lock door 158 may be closed to block or seal the inner space of the first load lock 154. In addition, when the inner space of the first load lock 154 is blocked or sealed, the pressure in the inner space of the first load lock 154 may be controlled by vacuum pressure. Accordingly, the pressure around the first wafer inside the inner space of the first load lock 154 may be formed as a vacuum pressure.

Additionally, the wafer processing method according to the example embodiment of the present disclosure may include unloading a first wafer inside the first load lock 150 using a wafer transfer arm 55 (refer to FIG. 6), putting the first wafer into at least one of a plurality of a wafer processing chamber 65 (refer to FIG. 6) using the wafer transfer arm 55, and processing the first wafer inside the at least one of the wafer processing chamber 65.

Also, additionally, a wafer processing method according to an example embodiment of the present disclosure may further include unloading the processed first wafer from the wafer processing chamber 65 using the wafer transfer arm 55 to put the processed first wafer into the first load lock 154, controlling the internal pressure of the first load lock 154 to be substantially the same as or similar to the internal pressure of the first EFEM chamber 134, opening the first load lock door 158 so that the inner space of the first load lock 154 communicates with the inner space of the first EFEM chamber 134, unloading the first wafer from the first load lock 154 using the first EFEM arm 185 to put the first wafer into the first wafer carrier C1 seated on the first wafer carrier support 168, unloading the first wafer carrier C1 from the first EFEM chamber 134 using the first EFEM arm 160 to put the first wafer carrier C1 into the first atmosphere control chamber 114, and collecting the first wafer carrier C1 from the first atmosphere control chamber 114 by using the wafer carrier transfer apparatus 30.

According to one or more embodiments, wafer processing apparatuses (e.g., wafer processing apparatus 1 and wafer processing apparatus 2) may further comprise a controller comprising at least one processor and memory storing computer instructions. The computer instructions, when executed by the at least one processor, may be configured to cause the controller to control any number of components of a wafer processing apparatus to perform their functions. For example, the computer instructions may be configured to cause the controller to cause one or more of the wafer processing methods of embodiments of the present disclosure to be performed by controlling, for example, a wafer carrier transfer apparatus, atmosphere control chamber doors, upper air supply devices, EFEM chamber doors, lower air supply devices, wafer mapping devices, EFEM arms, load lock doors, a wafer transfer arm, wafer aligner(s), wafer processing chambers, processing boxes, etc., to perform their respective functions.

While non-limiting example embodiments of the present disclosure have been particularly shown and described, it will be understood that various changes in form and details may be made to embodiments of the present disclosure without departing from the spirit and scope of the present disclosure.

What is claimed is:

1. A wafer processing apparatus comprising:
   a first equipment front end module (EFEM) comprising:
      a first atmosphere control chamber configured to store a first wafer carrier for accommodating a first wafer;
      a first upper air supplier configured to provide air into the first atmosphere control chamber;
      a first EFEM chamber under the first atmosphere control chamber;
      a first load lock vertically overlapped by at least a portion of the first EFEM chamber; and
      a first EFEM arm configured to transfer the first wafer carrier within the first atmosphere control chamber, the first EFEM chamber, and the first load lock;
   a wafer transfer chamber connected to the first load lock of the first EFEM;
   a plurality of wafer processing chambers connected to the wafer transfer chamber and providing a processing space for the first wafer; and
   a wafer transfer arm in the wafer transfer chamber, the wafer transfer arm configured to unload the first wafer from the first load lock and put the first wafer into at least one of the plurality of wafer processing chambers.

2. The wafer processing apparatus of claim 1, further comprising:
   a second EFEM spaced apart from the first EFEM in a horizontal direction, the second EFEM comprising:
      a second atmosphere control chamber configured to store a second wafer carrier accommodating a second wafer;
      a second upper air supplier configured to supply air into the second atmosphere control chamber;
      a second EFEM chamber under the second atmosphere control chamber;
      a second load lock vertically overlapped by at least a portion of the second EFEM chamber and connected to the wafer transfer chamber; and
      a second EFEM arm configured to transfer the second wafer carrier within the second atmosphere control chamber, the second EFEM chamber, and the second load lock.

3. The wafer processing apparatus of claim 2, further comprising:
   a wafer aligner connected to the wafer transfer chamber and configured to align at least one from among the first wafer and the second wafer,
   wherein the wafer transfer arm is configured to:
      unload the first wafer from the first load lock and put the first wafer into the wafer aligner, or
      unload the second wafer from the second load lock and put the second wafer into the wafer aligner.

4. The wafer processing apparatus of claim 3, wherein when the wafer processing apparatus is viewed from a planar view, the wafer aligner is arranged between the first EFEM and the second EFEM.

5. The wafer processing apparatus of claim 1, further comprising:
   a wafer carrier transfer line above the first EFEM; and
   a wafer carrier transfer robot configured to move horizontally along the wafer carrier transfer line and move in a vertical direction to put the first wafer carrier into the first atmosphere control chamber.

6. The wafer processing apparatus of claim 1, wherein the first EFEM further comprises:
   a first atmosphere control chamber door configured to open and close an opening of the first atmosphere control chamber; and
   a first EFEM chamber door configured to open and close a path between the first atmosphere control chamber and the first EFEM chamber.

7. The wafer processing apparatus of claim 1, wherein the first EFEM further comprises a first load lock door configured to open and close a path between the first EFEM chamber and the first load lock.

8. The wafer processing apparatus of claim 1, wherein the first EFEM further comprises a first lower air supplier configured to supply air into the first EFEM chamber.

9. A wafer processing apparatus comprising:
a first equipment front end module (EFEM) comprising:
a first atmosphere control chamber configured to store a first wafer carrier for accommodating a first wafer;
a first upper air supplier configured to supply air into the first atmosphere control chamber;
a first EFEM chamber under the first atmosphere control chamber;
a first load lock vertically overlapped by at least a portion of the first EFEM chamber;
a first wafer aligner vertically overlapped by at least the portion of the first EFEM chamber and configured to align the first wafer; and
a first EFEM arm configured to:
unload the first wafer carrier from the first atmosphere control chamber and put the first wafer carrier into the first EFEM chamber, or
unload the first wafer from the first wafer carrier and put the first wafer into at least one from among the first load lock and the first wafer aligner;
a wafer transfer chamber connected to the first load lock of the first EFEM;
a plurality of wafer processing chambers connected to the wafer transfer chamber and providing a processing space for the first wafer; and
a wafer transfer arm in the wafer transfer chamber, the wafer transfer arm configured to unload the first wafer from the first load lock and put the first wafer into at least one of the plurality of wafer processing chambers.

10. The wafer processing apparatus of claim 9, further comprising:
a second EFEM spaced apart from the first EFEM in a horizontal direction, the second EFEM comprising:
a second atmosphere control chamber configured to store a second wafer carrier accommodating a second wafer;
a second upper air supplier configured to supply air into the second atmosphere control chamber;
a second EFEM chamber under the second atmosphere control chamber;
a second load lock vertically overlapped by at least a portion of the second EFEM chamber and connected to the wafer transfer chamber;
a second wafer aligner vertically overlapped by at least the portion of the second EFEM chamber and configured to align the second wafer; and
a second EFEM arm configured to:
unload the second wafer carrier from the second atmosphere control chamber and put the second wafer carrier into the second EFEM chamber, or
unload the second wafer from the second wafer carrier and put the second wafer into at least one from among the second load lock and the second wafer aligner.

11. The wafer processing apparatus of claim 10, wherein the wafer transfer chamber is arranged between the first EFEM and the second EFEM,
the first load lock vertically overlaps, or is vertically overlapped by, the first wafer aligner, and
the second load lock vertically overlaps, or is vertically overlapped by, the second wafer aligner.

12. The wafer processing apparatus of claim 9, wherein the first EFEM further comprises a first wafer mapping device on a side of the first EFEM and configured to identify at least one from among a number and a position of the first wafer in the first wafer carrier.

13. The wafer processing apparatus of claim 9, wherein the first EFEM further comprises:
a first atmosphere control chamber door configured to open and close an opening of the first atmosphere control chamber; and
a first EFEM chamber door configured to open and close a path between the first atmosphere control chamber and the first EFEM chamber.

14. The wafer processing apparatus of claim 9, wherein the first EFEM further comprises a first load lock door configured to open and close a path between the first EFEM chamber and the first load lock.

15. A wafer processing method comprising:
putting a wafer carrier accommodating a wafer into an inner space of an atmosphere control chamber of an equipment front end module (EFEM);
closing the inner space of the atmosphere control chamber while the wafer carrier is within the inner space of the atmosphere control chamber;
controlling an atmosphere of the inner space of the atmosphere control chamber to be the same as an atmosphere of an inner space of an EFEM chamber of the EFEM;
connecting the inner space of the atmosphere control chamber and the inner space of the EFEM chamber to each other; and
unloading, by an EFEM arm within the EFEM, the wafer carrier from the atmosphere control chamber and putting, by the EFEM arm, the wafer carrier into the EFEM chamber.

16. The wafer processing method of claim 15, further comprising:
fixing the wafer carrier within the EFEM; and
checking, while the wafer carrier is fixed, at least one from among a number and a position of the wafer in the wafer carrier.

17. The wafer processing method of claim 15, wherein the controlling of the atmosphere of the inner space of the atmosphere control chamber to be the same as the atmosphere of the inner space of the EFEM chamber comprises:
controlling at least one from among humidity, temperature, and pressure of the inner space of the atmosphere control chamber to be the same as humidity, temperature, and pressure of the inner space of the EFEM chamber, respectively.

18. The wafer processing method of claim 15, further comprising:
connecting an inner space of a load lock and the inner space of the EFEM chamber with each other, and putting, by the EFEM arm, the wafer carrier into the inner space of the load lock; and
closing, while the wafer carrier is within the inner space of the load lock, the inner space of the load lock and forming a vacuum pressure in the inner space of the load lock,
wherein the EFEM includes the load lock and the load lock is overlapped by at least a portion of the EFEM chamber in a vertical direction.

19. The wafer processing method of claim 18, further comprising:
unloading, using a wafer transfer arm, the wafer from the wafer carrier provided in the inner space of the load lock, wherein the wafer transfer arm is provided in a wafer transfer chamber connected to the inner space of the load lock;

putting, using the wafer transfer arm, the wafer into a wafer processing chamber;

processing the wafer inside the wafer processing chamber; and unloading, by the wafer transfer arm, the processed wafer from the wafer processing chamber and putting, by the wafer transfer arm, the processed wafer into the wafer carrier inside the load lock.

20. The wafer processing method of claim 15, further comprising:

connecting an inner space of a load lock and the inner space of the EFEM chamber;

unloading, by the EFEM arm, the wafer from the wafer carrier and putting, by the EFEM arm, the wafer into the inner space of the load lock;

closing, while the wafer is in the inner space of the load lock, the inner space of the load lock and forming a vacuum pressure in the inner space of the load lock;

unloading, by a wafer transfer arm, the wafer provided in the inner space of the load lock, wherein the wafer transfer arm is provided in a wafer transfer chamber connected to the inner space of the load lock;

putting, by the wafer transfer arm, the wafer into a wafer processing chamber;

processing the wafer inside the wafer processing chamber; and unloading, by the wafer transfer arm, the processed wafer from the wafer processing chamber and putting, by the wafer transfer arm, the processed wafer into the load lock, wherein the EFEM includes the load lock and the load lock is overlapped by at least a portion of the EFEM chamber in a vertical direction.

* * * * *